United States Patent
Murooka et al.

[11] Patent Number: 6,028,317
[45] Date of Patent: Feb. 22, 2000

[54] CHARGED PARTICLE BEAM OPTICAL ELEMENT CHARGED PARTICLE BEAM EXPOSURE APPARATUS AND METHOD OF ADJUSTING THE SAME

[75] Inventors: Ken-ichi Murooka, Yokohama; Munehiro Ogasawara, Fujisawa; Hitoshi Sunaoshi, Yokohama, all of Japan

[73] Assignee: Kabushiki Kaisha Toshiba, Kawasaki, Japan

[21] Appl. No.: 09/005,640

[22] Filed: Jan. 12, 1998

[30] Foreign Application Priority Data

Jan. 13, 1997 [JP] Japan ................................ 9-003764
Sep. 24, 1997 [JP] Japan ................................ 9-258384
Dec. 8, 1997 [JP] Japan ................................ 9-337331

[51] Int. Cl.[7] .......................... H01J 37/12; H01J 37/14; H01J 3/14; G21K 1/08
[52] U.S. Cl. .......................... 250/492.23; 250/396 R; 250/396 ML
[58] Field of Search .................... 250/492.23, 396 R, 250/396 ML

[56] References Cited

U.S. PATENT DOCUMENTS 4,544,846  10/1985  Langner et al. ............... 250/396 ML

OTHER PUBLICATIONS

Hiroshi Daimon, "New Display–Type Analyzer For The Energy And The Angular Distribution Of Charged Particles," Rev. Instrum., vol. 59, No. 4, (1988), pp. 545–549.

Primary Examiner—Edward P. Westin
Assistant Examiner—Nikita Wells
Attorney, Agent, or Firm—Oblon, Spivak, McClelland, Maier & Neustadt, P.C.

[57] ABSTRACT

An optical element includes two electrodes 1 and 2 arranged at a distance to oppose each other and configured to converge an electron beam. The opposing surfaces of the electrodes 1 and 2 are so formed as to be cylindrically symmetrical along the beam passing direction and to form curves obtained by deforming hyperbolas in a direction perpendicular to the beam passing direction, in order that an electric field whose effective part except for an arbitrary constant of the field potential is given by $$\phi = (k/2)r^2 - \alpha \ln r - kz^2$$

is spatially partially formed in a cylindrical coordinate system defined by (r, z, θ).

51 Claims, 18 Drawing Sheets

CHARGED PARTICLE BEAM OPTICAL ELEMENT CHARGED PARTICLE BEAM EXPOSURE APPARATUS AND METHOD OF ADJUSTING THE SAME

BACKGROUND OF THE INVENTION

The present invention relates to a charged particle beam optical element and a charged particle beam optical system using the element.

The present invention also relates to a charged particle beam exposure apparatus using the charged particle beam optical element and a method of adjusting the apparatus.

Recently, with increasing packing density of semiconductor devices, the circuit patterns of the constituent LSI devices have become finer increasingly. The formation of such fine patterns requires not only small line widths but improvements in the dimensional accuracy and positional accuracy of the patterns.

Many techniques have been developed to meet these demands. Most of these techniques use a method by which a charged particle beam represented by an electron beam is used to directly draw a circuit pattern on a semiconductor substrate, or a charged particle beam represented by an electron beam is used to draw a transfer mask and this mask pattern is transferred onto a semiconductor substrate by using light such as ultraviolet radiation or X-rays or a charged particle beam such as an electron beam or an ion beam. Accordingly, to form fine patterns with high accuracy, it is important to increase the accuracy with which patterns are formed by using a charged particle beam represented by an electron beam.

On the other hand, in addition to an increase in the packing density of semiconductor devices, the device size (so-called chip size) is increasing. Accordingly, a very long time is necessary to draw a circuit pattern of a single LSI device. This leads to a decrease in the throughput, i.e., a decrease in the productivity. Generally, high accuracy and high speed conflict with each other. In particular, the throughput of pattern formation using a charged particle beam is known to be low, although its accuracy is high.

BRIEF SUMMARY OF THE INVENTION

Conventionally, various charged particle optical systems have been proposed for the purpose of forming patterns by using charged particles. However, it is difficult for these charged particle optical systems to sufficiently decrease various aberrations. Especially when the field size is to be increased to improve the throughput, extremely large aberrations are produced to make the systems impractical.

As described above, it is difficult for the conventional charged particle beam optical systems to meet conflicting demands, i.e., a reduction in the aberration and an increase in the field size. As a consequence, high-accuracy, high-speed pattern formation is difficult to perform.

The present invention has been made in consideration of the above situations and has its object to provide a charged particle beam optical element capable of high-accuracy, high-speed pattern formation by preventing an extreme increase in aberrations even when the field size is increased.

It is another object of the present invention to provide a charge particle beam optical system and a charged particle beam exposure apparatus using the above charged particle beam optical element.

To achieve the above objects, the first aspect of the present invention provides a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory. FIG. 8 illustrates the relationships between the above-discussed directions. Specifically, the binormal direction to the trajectory of the beam 32 (shown as the curved arrow) is shown as arrow 35 and the principal normal direction to the trajectory of the beam is shown as arrow 36.

The second aspect of the present invention provides a charged particle beam optical element according to the first aspect, wherein a straight line formed in a position where a trajectory of a central axis of the charged particle beam intersects a normal plane matches an axis of rotational symmetry of the electromagnetic field.

The third aspect of the present invention provides a charged particle beam optical element according to the second aspect, wherein the axis of rotational symmetry exists outside a region where the charged particle beam passes.

The fourth aspect of the present invention provides a charged particle beam optical element according to the first or second aspect, wherein a focal length in the principal normal direction to the trajectory of the central axis of the charged particle beam is equal to a focal length in the binormal direction to the trajectory.

The fifth aspect of the present invention provides a charged particle beam optical element according to the first or second aspect, wherein a focal length in the principal normal direction to the trajectory of the central axis of the charged particle beam is different from a focal length in the binormal direction to the trajectory.

The sixth aspect of the present invention provides a charged particle beam optical element which spatially partially forms an electric field whose effective part except for an arbitrary constant of a field potential is given by $$\phi = (k/2)r^2 - \alpha \ln r - kz^2$$

(k, α: arbitrary constants)
in a cylindrical coordinate system defined by (r, z, θ).

The seventh aspect of the present invention provides a charged particle beam optical element which comprises two electrodes arranged to oppose each other at a distance and functions as a charged particle beam lens for converging a charged particle beam by passing the beam between the electrodes, wherein opposing surfaces of the electrodes are cylindrically symmetrical and represented by $$(k/2)r^2 - \alpha \ln r - kz^2 = C$$

(C is a constant).

The eighth aspect of the present invention provides a charged particle beam optical element according to the sixth or seventh aspect, wherein an electron beam is used as the charged particle beam, and letting E and e be energy and elementary charge of the electron beam, respectively, a condition given by $$2 < e\, \alpha/E < 4$$

is satisfied.

The ninth aspect of the present invention provides a charged particle beam optical element according to the seventh aspect, wherein a radius $r_0$ of a trajectory of a central axis of the charged particle beam is smaller than an average value of radii $r_{in}$ and $r_{out}$ of the two electrodes when z=0.

The tenth aspect of the present invention provides a charged particle beam optical element which spatially partially forms a magnetic field, through which a charged particle beam passes, whose effective part except for an arbitrary function (a function which satisfies rot F=0) of a magnetic vector potential is given by $$A_r=0$$
$$A_\theta=-(2k/3)r^2+\alpha r+kz^2$$
$$A_z=0$$

in a cylindrical coordinate system defined by (r, z, θ).

The eleventh aspect of the present invention provides a charged particle beam optical element which comprises at least three magnetic poles arranged to oppose each other at a distance and functions as a charged particle lens for converging a charged particle beam by passing the beam between the magnetic poles, wherein opposing surfaces of at least two of the three magnetic poles are cylindrically symmetrical and represented by $$-2\, krz+2\,\alpha z=C$$

(C is a constant).

The twelfth aspect of the present invention passing through the electromagnetic field larger in a binormal direction to a trajectory of the beam than in a principal normal direction to the trajectory, and the projecting optical system comprises a second charged particle beam optical element which forms a partially rotationally symmetrical electromagnetic field in at least a portion of a space and makes a sectional shape of a charged particle beam irradiated from the illuminating optical system and passing through the electromagnetic field larger in a binormal direction to a trajectory of the beam than in a principal normal direction to the trajectory.

The fifteenth aspect of the present invention provides a charged particle beam optical system comprising an illuminating optical system for irradiating a charged particle beam emitted from a beam source onto a mask and a projecting optical system for irradiating the charged particle beam being obtained by irradiating the mask from the illuminating optical system onto a substrate to be exposed, wherein the illuminating optical system comprises a first charged particle beam optical element which spatially partially forms an electric field whose effective part except for an arbitrary constant of a field potential is given by $$\phi=(k/2)r^2-\alpha \ln r-kz^2$$

(k, α: arbitrary constants)
provides a charged particle beam optical element according to the tenth or eleventh aspect, wherein an electron beam is used as the charged particle beam, and letting E, e, and $m_0$ be energy, elementary charge, and rest mass of the electron beam, respectively, conditions given by $$\alpha>0 \text{ and } \alpha^2 \geq (4k/e)\cdot\{m_0 E/2\}^{(1/2)}$$

are satisfied.

The thirteenth aspect of the present invention provides a charged particle beam optical element according to the tenth to twelfth aspects, wherein a radius $r_0$ of a trajectory of a central axis of the charged particle beam satisfies a condition given by $$r_0<3\,\alpha/(4k)$$

The fourteenth aspect of the present invention provides a charged particle beam optical system comprising an illuminating optical system for irradiating a charged particle beam emitted from a beam source onto a mask and a projecting optical system for irradiating the charged particle beam being obtained by irradiating the mask from the illuminating optical system onto a substrate to be exposed, wherein the illuminating optical system comprises a first charged particle beam optical element which forms a partially rotationally symmetrical electromagnetic field in at least a portion of a space and makes a sectional shape of a charged particle beam in a cylindrical coordinate system defined by (r, z, θ), and the projecting optical system comprises a second charged particle beam optical element which spatially partially forms an electric field whose effective part except for an arbitrary constant of a field potential is given by $$\phi=(k'/2)r^2-\alpha' \ln r-k'z^2$$

(k', α': arbitrary constants)
in a cylindrical coordinate system defined by (r, z, θ).

The sixteenth aspect of the present invention provides a charged particle beam optical system comprising an illuminating optical system for irradiating a charged particle beam emitted from a beam source onto a mask and a projecting optical system for irradiating the charged particle beam being obtained by irradiating the mask from the illuminating optical system onto a substrate to be exposed, wherein the illuminating optical system comprises a first charged particle beam optical element which spatially partially forms a magnetic field whose effective part except for an arbitrary function (a function which satisfies rot F=0) of a magnetic vector potential is given by $$Ar=0$$
$$A_\theta=-(2k/3)r^2+\alpha r+kz^2$$
$$Az=0$$

(k, α: arbitrary constants)
in a cylindrical coordinate system defined by (r, z, θ), and the projecting optical system comprises a second charged particle beam optical element which spatially partially forms a magnetic field whose effective part except for an arbitrary function (a function which satisfies rot F=0) of a magnetic vector potential is given by $$Ar=0$$
$$A_\theta=-(2k'/3)r^2+\alpha' r+k'z^2$$
$$Az=0$$

(k', α': arbitrary constants)
in a cylindrical coordinate system defined by (r, z, θ).

The seventeenth aspect of the present invention provides a charged particle beam optical system according to the fourteenth to sixteenth aspects, wherein the illuminating optical system comprises:

a quadrupole lens for correcting defocusing in r- and z-axis directions of the charged particle beam emitted from the beam source; and an alignment lens for adjusting an optical axis of the charged particle beam emitted from the beam source.

The eighteenth aspect of the present invention provides a charged particle beam optical system according to the fourteenth to sixteenth aspects, wherein the projecting optical system comprises:

a quadrupole lens for correcting defocusing in r- and z-axis directions of the charged particle beam emitted from the illuminating optical system;

an alignment lens for adjusting an optical axis of the charged particle beam emitted from the illuminating optical system; and adjusting means for adjusting a relative rotational relationship between the second charged particle beam optical element and the quadrupole lens with respect to the optical axis.

The nineteenth aspect of the present invention provides a charged particle beam exposure apparatus comprising:

an illuminating optical system for irradiating a charged particle beam emitted from a beam source onto a mask; and a projecting optical system for irradiating the charged particle beam being obtained by irradiating the mask from the illuminating optical system onto a substrate to be exposed, wherein the illuminating optical system comprises a first charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, and the projecting optical system comprises a second charged particle beam optical element which forms a partially rotationally symmetrical electromagnetic field in at least a portion of a space and makes a sectional shape of a charged particle beam irradiated from the illuminating optical system and passing through the electromagnetic field larger in a binormal direction to a trajectory of the beam than in a principal normal direction to the trajectory.

The twentieth aspect of the present invention provides a charged particle beam optical system according to the fourteenth to sixteenth aspects, further comprising an alignment mechanism for adjusting a relative position of the mask and the substrate, and a mechanism for scanning a relative positional relationship between the mask, the substrate, and the projecting optical system while the alignment mechanism is in operation.

The twenty-first aspect of the present invention provides a charged particle beam exposure apparatus according to the nineteenth aspect, further comprising an alignment mechanism for adjusting a relative position of the mask and the substrate, and a mechanism for scanning a relative positional relationship between the mask, the substrate, and the projecting optical system while the alignment mechanism is in operation.

The twenty-second aspect of the present invention provides a charged particle beam exposure apparatus comprising:

an illuminating optical system for irradiating a charged particle beam emitted from a first beam source onto a mask;

a projecting optical system for irradiating the charged particle beam being obtained by irradiating the mask from the illuminating optical system onto a substrate to be exposed; and an adjusting optical system for irradiating a charged particle beam, emitted from a second beam source to adjust the projecting optical system, onto the projecting optical system, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

The twenty-third aspect of the present invention provides a charged particle beam exposure apparatus according to the twenty-second aspect, wherein the illuminating optical system further comprises deflecting means for deflecting the charged particle beam emitted from the first beam source, and the projecting optical system further comprises correcting means for performing correction, on the basis of a deflection amount of the charged particle beam deflected by the deflecting means, so as to match an optical axis of the charged particle beam deflected by the deflecting means with an optical axis of the illuminating optical system.

The twenty-fourth aspect of the present invention provides a charged particle beam exposure apparatus according to the twenty-second aspect, wherein the mask is selected from a plurality of masks, different in reduction ratio to the substrate to be exposed, in accordance with a pattern to be transferred to the substrate.

The twenty-fifth aspect of the present invention provides a method of adjusting a charged particle beam exposure apparatus comprising:

an illuminating optical system for irradiating a charged particle beam emitted from a first beam source onto a mask;

a projecting optical system for irradiating the charged particle beam being obtained by irradiating the mask from the illuminating optical system onto a substrate to be exposed; and an adjusting optical system for irradiating a charged particle beam, emitted from a second beam source to adjust the projecting optical system, onto the projecting optical system, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the steps of:

adjusting the illuminating optical system by using the charged particle beam emitted from the first beam source; and adjusting the projecting optical system by using the charged particle beam irradiated from the adjusting optical system.

The twenty-sixth aspect of the present invention provides an adjusting method according to the twenty-fifth aspect, wherein the illuminating optical system further comprises deflecting means for deflecting the charged particle beam emitted from the first beam source, and the projecting optical system further comprises correcting means for performing correction, on the basis of a deflection amount of the charged particle beam deflected by the deflecting means, so that an optical axis of the charged particle beam deflected by the deflecting means matches an optical axis of the illuminating optical system, further comprising the step of performing correction, on the basis of the deflection amount of the charged particle beam deflected by the deflecting means, so as to match the optical axis of the charged particle beam deflected by the deflecting means with the optical axis of the illuminating optical system, after the step of adjusting the projecting optical system.

The twenty-seventh aspect of the present invention provides an adjusting method according to the twenty-fifth aspect, wherein the mask is selected from a plurality of masks, different in reduction ratio to the substrate to be exposed, in accordance with a pattern to be transferred to the substrate.

The twenty-eighth aspect of the present invention provides a charged particle beam exposure apparatus comprising:

an illuminating optical system for irradiating a charged particle beam emitted from a beam source onto a mask mounted on a first stage;

a projecting optical system for irradiating the charged particle beam being obtained by irradiating the mask from the illuminating optical system onto a substrate to be exposed mounted on a second stage;

first measuring means for measuring a position of the first stage;

second measuring means for measuring a position of the second stage;

calculating means for calculating a first deviation amount indicating a deviation of the first stage from a predetermined position on the basis of the position of the first stage measured by the first measuring means and a second deviation amount indicating a deviation of the second stage from a predetermined position on the basis of the position of the second stage measured by the second measuring means; and correcting means for correcting a position, on the substrate, of the charged particle beam irradiated onto the substrate on the basis of the first and second deviation amounts calculated by the calculating means, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

The twenty-ninth aspect of the present invention provides a charged particle beam exposure apparatus comprising:

an illuminating optical system for irradiating a charged particle beam emitted from a beam source onto a mask mounted on a first stage;

a projecting optical system for irradiating the charged particle beam being obtained by irradiating the mask from the illuminating optical system onto a substrate to be exposed mounted on a second stage;

first measuring means for measuring a vertical distance to a surface of the substrate;

second measuring means for measuring an inclination of the surface of the substrate to an optical axis of the charged particle beam; and correcting means for correcting the vertical distance to the surface of the substrate to a predetermined distance on the basis of the vertical distance measured by the first measuring means and correcting the surface of the substrate to be perpendicular to the optical axis of the charged particle beam on the basis of the inclination measured by the second measuring means, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

The thirtieth aspect of the present invention provides a charged particle beam exposure apparatus comprising:

an illuminating optical system for irradiating a charged particle beam emitted from a beam source onto a mask mounted on a first stage;

a projecting optical system for irradiating the charged particle beam being obtained by irradiating the mask from the illuminating optical system onto a substrate to be exposed mounted on a second stage;

calculating means for calculating distortion to be applied to the mask to obtain desired positioning accuracy; and distortion applying means for applying distortion to the mask on the basis of the distortion calculated by the calculating means, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

The thirty-first aspect of the present invention provides a charged particle beam exposure apparatus comprising:

an illuminating optical system for irradiating a charged particle beam emitted from a beam source onto a mask mounted on a first stage; and a projecting optical system for irradiating the charged particle beam being obtained by irradiating the mask from the illuminating optical system onto a substrate to be exposed mounted on a second stage;

wherein the illuminating optical system comprises:
shaping means for shaping the charged particle beam into a charged particle beam having a linear section; and deflecting means for deflecting the whole charged particle beam shaped by the shaping means in a direction of the linear section of the charged particle beam, and at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

The thirty-second aspect of the present invention provides a charged particle beam exposure apparatus comprising:

an illuminating optical system for irradiating a charged particle beam emitted from a beam source onto a mask mounted on a first stage; and a projecting optical system for irradiating a charged particle beam being obtained by irradiating the mask from the illuminating optical system onto a substrate to be exposed mounted on a second stage;

wherein the beam source comprises:

a wedge-shaped charged particle emission electrode; and an electrode surrounding the charged particle emission electrode, and at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

The thirty-third aspect of the present invention provides a method of adjusting a charged particle beam exposure apparatus comprising:

an illuminating optical system for irradiating a charged particle beam emitted from a beam source onto a mask mounted on a first stage;

a projecting optical system for irradiating the charged particle beam being obtained by irradiating the mask from the illuminating optical system onto a substrate to be exposed mounted on a second stage;

first measuring means for measuring a position of the first stage;

second measuring means for measuring a position of the second stage;

calculating means for calculating a first deviation amount indicating a deviation of the first stage from a predetermined position on the basis of the position of the first stage measured by the first measuring means and a second deviation amount indicating a deviation of the second stage from a predetermined position on the basis of the position of the second stage measured by the second measuring means; and correcting means for correcting a position, on the substrate, of the charged particle beam irradiated onto the substrate on the basis of the first and second deviation amounts calculated by the calculating means, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the steps of:

measuring the position of the first stage by using the first measuring means and the position of the second stage by using the second measuring means;

calculating the first deviation amount indicating a deviation of the first stage from a predetermined position on the basis of the position of the first stage measured by the first measuring means and the second deviation amount indicating a deviation of the second stage from a predetermined position on the basis of the position of the second stage measured by the second measuring means by using the calculating means; and correcting the position, on the substrate, of the charged particle beam irradiated onto the substrate on the basis of the first and second deviation amounts calculated by the calculating means by using the correcting means.

The thirty-fourth aspect of the present invention provides a method of adjusting a charged particle beam exposure apparatus comprising:

an illuminating optical system for irradiating a charged particle beam emitted from a beam source onto a mask mounted on a first stage;

a projecting optical system for irradiating the charged particle beam being obtained by irradiating the mask from the illuminating optical system onto a substrate to be exposed mounted on a second stage;

first measuring means for measuring a vertical distance to a surface of the substrate;

second measuring means for measuring an inclination of the surface of the substrate to an optical axis of the charged particle beam; and correcting means for correcting the vertical distance to the surface of the substrate to a predetermined distance on the basis of the vertical distance measured by the first measuring means and correcting the surface of the substrate to be perpendicular to the optical axis of the charged particle beam on the basis of the inclination measured by the second measuring means, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the steps of:

measuring the vertical distance to the surface of the substrate by using the first measuring means;

measuring the inclination of the surface of the substrate to the optical axis of the charged particle beam by using the second measuring means; and correcting the vertical distance to the surface of the substrate to a predetermined distance on the basis of the vertical distance measured by the first measuring means and correcting the surface of the substrate to be perpendicular to the optical axis of the charged particle beam on the basis of the inclination measured by the second measuring means by using the correcting means.

The thirty-fifth aspect of the present invention provides a method of adjusting a charged particle beam exposure apparatus comprising:

an illuminating optical system for irradiating a charged particle beam emitted from a beam source onto a mask mounted on a first stage;

a projecting optical system for irradiating the charged particle beam being obtained by irradiating the mask from the illuminating optical system onto a substrate to be exposed mounted on a second stage;

calculating means for calculating distortion to be applied to the mask to obtain desired positioning accuracy; and distortion applying means for applying distortion to the mask on the basis of the distortion calculated by the calculating means, wherein at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the steps of:

calculating the distortion to be applied to the mask to obtain desired positioning accuracy by using the calculating means; and applying distortion to the mask on the basis of the distortion calculated by the calculating means by using the distortion applying means.

The thirty-sixth aspect of the present invention provides a method of adjusting a charged particle beam exposure apparatus comprising:

an illuminating optical system for irradiating a charged particle beam emitted from a beam source onto a mask mounted on a first stage; and a projecting optical system for irradiating the charged particle beam being obtained by irradiating the mask from the illuminating optical system onto a substrate to be exposed mounted on a second stage;

wherein the illuminating optical system comprises:

shaping means for shaping the charged particle beam into a charged particle beam having a linear section; and deflecting means for deflecting the whole charged particle beam shaped by the shaping means in a direction of the linear section of the charged particle beam, and at least one of the illuminating optical system and the projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the step of, letting l and w be a length and a width, projected on the mask, of the charged particle beam shaped by the shaping means of the illuminating optical system, respectively, W be a width of a transfer region on the mask, and v be a moving velocity of the mask stage, scanning the whole charged particle beam shaped by the shaping means by using the deflecting means under conditions of a width of W+l or more and a period of w/nv (n: positive integer).

In the present invention, the electric field or the magnetic field in the cylindrical coordinate system is set as described above. Therefore, as will be described later, a field size large in the z direction can be realized while aberrations are kept small.

Accordingly, aberrations do not extremely increase even when the field size is increased, so high-accuracy, high-speed patter formation is possible. Also, the present invention is very useful since aberrations can be reduced only by changing the surface shape of the electrode or magnetic pole without adding any new special constituent element.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described in detail below by way of its embodiments shown in the accompanying drawings.

Note that practical expressions of equations will be summarized in the end of this chapter.

(First Embodiment)

To solve the problems described earlier, the present invention provides a lens which forms a partially rotationally symmetrical electromagnetic field in at least a portion of a space, and by which a straight line formed in a position where the trajectory of the central axis of a charged particle beam passing through the electromagnetic field intersects a normal plane substantially matches the axis of rotational symmetry, and the sectional shape of the beam is larger in the binormal direction to the trajectory than in the principal normal direction to the trajectory.

More specifically, an electric field having the following potential as shown in equation (1) is formed by using a cylindrical coordinate system, thereby forming a lens having a converging effect.

In conventional techniques, the field of a lens has an isotropic circular or square shape. In the present invention, however, the field of the lens is formed into an anisotropic elongated shape to solve the conventional problems.

Figure 8:
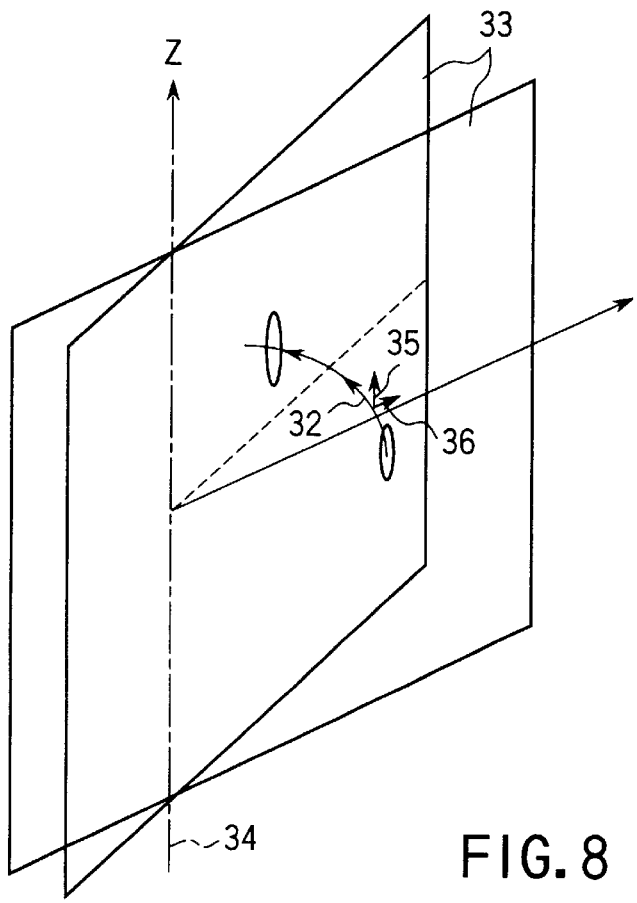
FIG. 8 is a view for explaining the trajectory of a beam.

As shown in FIG. 8, assume that a charged particle beam passes through a point apart from a rotational symmetric axis in an electromagnetic field which is partially rotationally symmetric. The center of the orbit of this beam can be a portion of a circular orbit around the point on the rotational symmetric axis due to the symmetry of the system.

In FIG. 8, reference numeral 32 denotes the center of the beam orbit; 33, the normal planes to the trajectory of the beam orbit center; 34, a rotational central axis; 35, the binormal to the trajectory of the beam orbit center; and 36, the principal normal to the beam orbit center.

In other words, a straight line formed in a position where the normal planes to the trajectory of the beam central axis intersect nearly matches the axis of rotational symmetry. At this time, by properly selecting the shape of potential, a lens having very small aberrations and a large field size can be formed in a direction along the axis of rotational symmetry, i.e., the binormal direction to the beam orbit center.

If conditions under which a lens effect exists in the principal normal direction perpendicular to the binormal direction are simultaneously obtained, the object lens can be obtained. This relationship will be described in more detail and precisely below by using mathematical expressions.

As can be readily calculated, the potential of this equation (1) satisfies a Laplace's equation ($\Delta\phi=0$). This proves that this potential is valid. From the equations of motion in a cylindrical coordinate system, charged particles (charge q) move in the potential of equation (1) in accordance with equations (2), (3), and (4).

Equation (4) shows that, if qk is negative, i.e., q and k have different signs, motion having a converging effect takes place in the z direction without any aberration regardless of the size of z. On the other hand, $r^2(d\theta/dt)=C$ (a constant independent of time) is obtained from equation (3). Therefore, substituting this relation into equation (2) yields equation (5).

Letting $r_0$ be the coordinate point of the equilibrium point, equation (6) is obtained from equation (5). Additionally, letting $\rho=r-r_0$ in equation (5) and using equation (6), the result of equation (7) is obtained.

Expanding the dominator for $\rho<<r_0$ and approximating it to a linear equation of $\rho$ yields equation (8).

Equation (8) demonstrates that, if $q(4k-2\alpha/r_0^2)$ is positive, motion having a converting effect takes place around $r_0$ in the r direction. Especially when $\alpha/r_0^2=3k$, the converging force of the motion in the r direction becomes equal to the converging force of the motion in the z direction. Consequently, a lens having symmetrical focal lengths is obtained.

The assumption that any displacement in the r direction is small is used in introducing the above result. Since no approximation is used in the z direction, no problem arises even in a range within which z is large. This indicates that a large field size can be realized in the z direction while aberrations are kept small.

Figure 1:
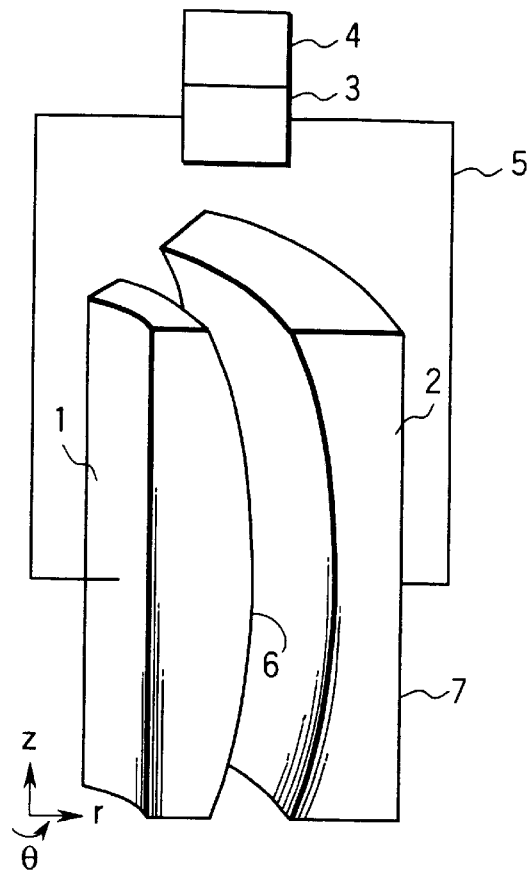
FIG. 1 is a perspective view showing the basic arrangement of an electron-beam lens according to the first embodiment of the present invention.
Figure 2:
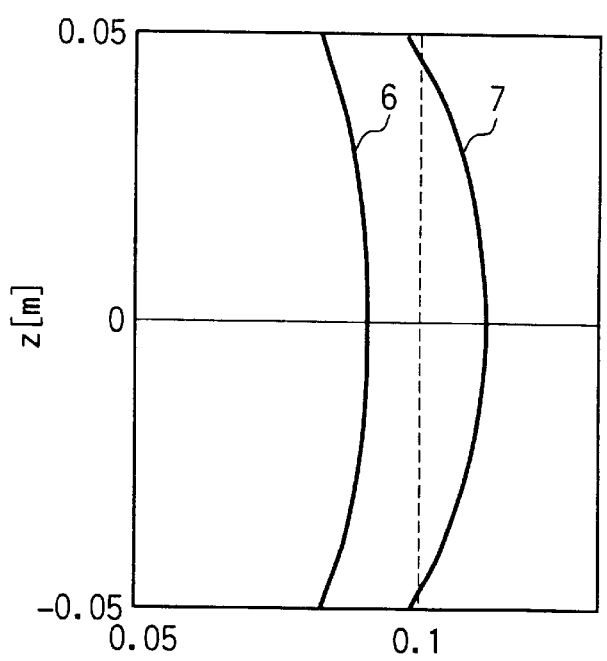
FIG. 2 is a schematic view for explaining the surface shape of the lens of the first embodiment.

A practical arrangement of a lens based on the above ideas will be described below. FIG. 1 is a schematic view of an electron-beam lens used in the first embodiment of the present invention. This lens is constituted by two electrodes 1 and 2. As shown in FIG. 2, inner walls 6 and 7 of the sections of these electrodes 1 and 2 are processed to have shapes given by equations (9) and (10). Voltage V=Vin−Vout is applied between the two electrodes.

More specifically, the inside electrode 1 and the outside electrode 2 are arranged at a distance to oppose each other. A predetermined voltage is applied between these electrodes 1 and 2 from a power supply 3 controlled by a power supply control system 4 through a shield cable 5.

In a cylindrical coordinate system defined by (r, z, θ), the inner walls (opposing surfaces) 6 and 7 of the electrodes 1 and 2 are cylindrically symmetrical along the θ-axis direction in which an electron beam is incident and form curves obtained by deforming hyperbolas along a direction perpendicular to the θ-axis direction.

When an electron (electric charge q=−e, rest mass=$m_0$) with kinetic energy E is incident on this lens in a direction parallel to the θ axis to satisfy (r, z)=($r_i$, $z_i$), solutions are given by equations (11) and (12) from equations (4) and (8).

$r_0$ is given by equation (13) from equation (6). On the other hand, an equation relating to θ is equation (14) under the same initial conditions from equation (3). Accordingly, when t=0 and θ=0, a solution given by equation (15) is obtained.

The solution can be obtained by substituting equation (11) into equation (15) and performing integration. As described previously, however, a case in which |r−$r_0$| is sufficiently small is used. Therefore, enough accuracy can be ensured in the following analysis even with the use of calculation results obtained when equation (15) is r=$r_i$=$r_0$. That is, θ is represented by equation (16), and equations (17) and (18) are obtained by rewriting equations (11) and (12) into expressions of the trajectory of an electron by using equation (16).

Assuming uniform linear motion from a lens trailing end (θ=$θ_e$), and letting ξ be the distance from the lens trailing end, the trajectory is expressed by equations (19) and (20) (note that a coordinate r is replaced by an orthogonal coordinate since this coordinate is not a cylindrical coordinate).

Accordingly, focal positions $ξ_{fr}$ (r direction) and $ξ_{fz}$ (z direction) are calculated by equations (21) and (22). Rewriting equations (21) and (22) by using equation (13) yields the results of equations (23) and (24).

A lens was designed on the basis of the above calculation results.

Equations (23) and (24) show that condition: 2<eα/E<4 must be satisfied to allow an optical element to function as a lens, and that a lens symmetrical with respect to r and z can be obtained when the lens is designed to satisfy eα/E=3.

For example, when a lens is designed by setting $r_{in}$=0.09 m, $r_{out}$=0.11 m, and θe=45° for Vin−Vout=4.02 kV and z=0 in equations (9) and (10) so that the potential k=1000 kV/$m^2$ and α=30 kV in equation (1) is given to an electron with an energy of 10 keV, the focal lengths are 0.10 m in both the r and z directions. Additionally, it is possible to ensure a field size of about 80 mm in the z direction.

Also, as can be seen from FIG. 2, in a region where the absolute value of z is large, the actual lens is curved toward a region where r is small. Therefore, to effectively use the lens it is preferable to design the lens such that $r_0$ as the lens center is smaller than the average value of $r_{in}$ and $r_{out}$ described above.

Figure 3:
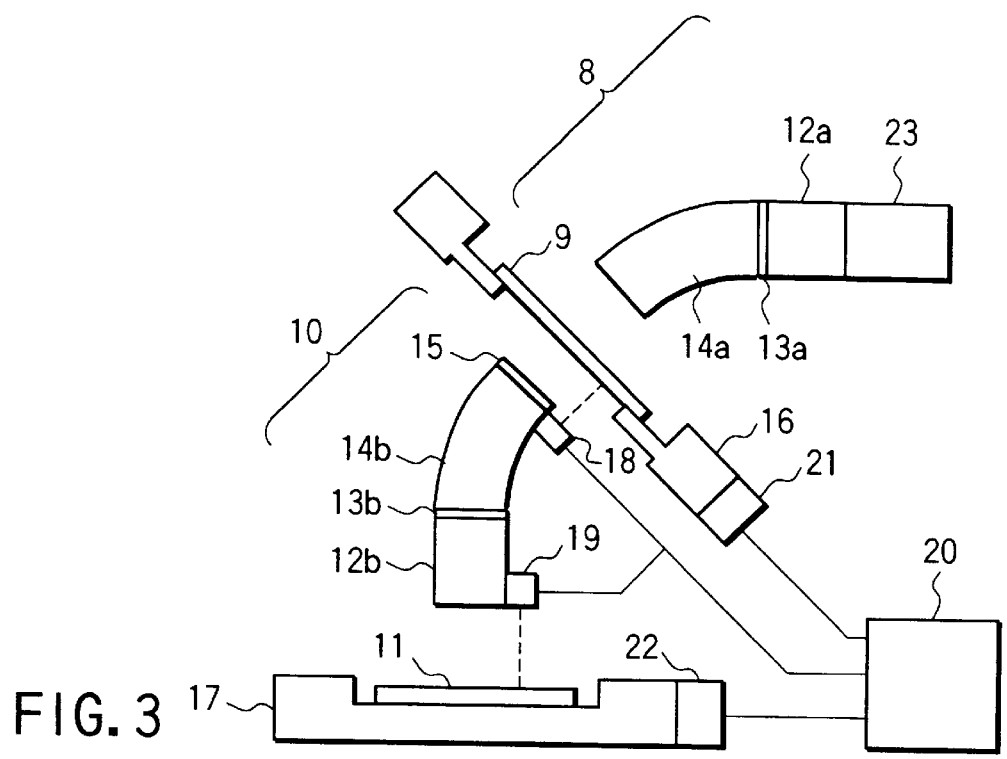
FIG. 3 is a view showing the arrangement of an exposure system constituted by using the lens of the first embodiment.

FIG. 3 is a view showing the arrangement of an exposure system constituted by using the lenses of this embodiment. The basic constituent elements are equal to those of a so-called scanning exposure apparatus using ultraviolet radiation as a light source. That is, the system comprises a beam source 23, an illuminating optical system 8, a mask 9, a projecting optical system 10, a substrate 11 to be exposed, and alignment mechanisms 18 and 19.

The illuminating optical system 8 is constituted by arranging, in the propagation direction of an electron beam, a quadrupole lens, an alignment lens 12a, a rotary axial alignment mechanism 13a, and a lens 14a of this embodiment. Similarly, the projecting optical system 10 is constituted by arranging a lens 14b of this embodiment, a rotary axial alignment mechanism 13b, a quadrupole lens, and an alignment lens 12b.

The mask 9 is placed on a mask stage 16, and the substrate 11 is placed on a substrate stage 17. The mask stage 16 and the substrate stage 17 are controlled by a mask stage control system 21 and a substrate stage control system 22, respectively, under the control of an alignment control system 20. Reference numeral 15 in FIG. 3 denotes a correcting electrode for performing energy correction.

Figure 4:
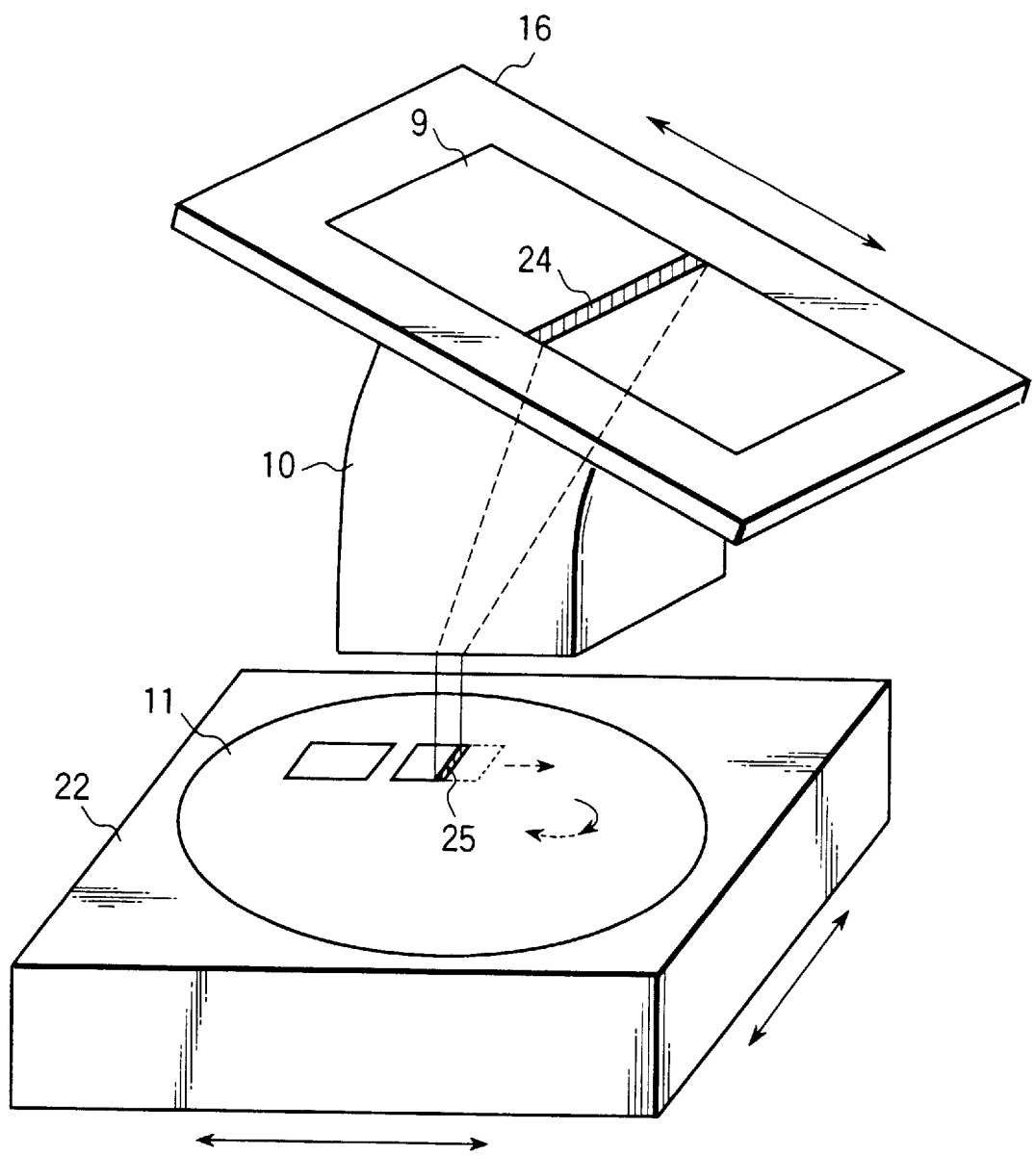
FIG. 4 is a perspective view showing an exposure (transfer) region in the first embodiment.

When exposure (transfer) is actually performed, as schematically shown in FIG. 4, the mask 9 and the substrate 11 are moved in an aligned state in synchronism with each other to scan elongated band-like exposure (transfer) regions 24 and 25, thereby exposing the whole region to be exposed (transferred).

Figure 5:
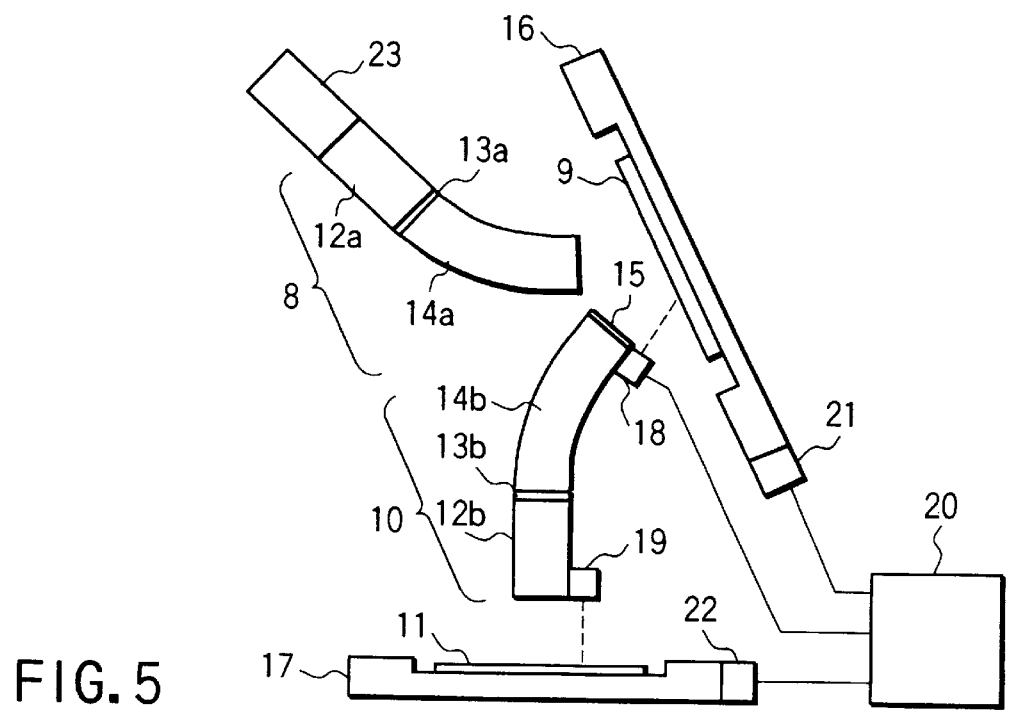
FIG. 5 is a view showing the arrangement of another exposure system using the lens of the first embodiment.

Although a so-called transmitting mask is used as the mask in FIG. 3, a reflecting mask can also be used as shown in FIG. 5. The arrangement shown in FIG. 5 is essentially the same as that shown in FIG. 3 except for the mask.

Since the lenses of this embodiment are not axially symmetrical, this exposure system includes quadrupole lenses for correcting defocusing in the r- and z-axis directions and a correcting electrode for performing energy correction, in addition to the common alignment lenses for axial adjustment. By combining these lenses, axial adjustment can be electrically readily performed even when mechanical adjustment is imperfect.

To perform axial alignment in the rotational direction between the lens of this embodiment and the quadrupole lens, a generally used rotary lens can be used. However, to fully utilize the advantages of small aberrations and a large field as the characteristic features of the present invention, it is desirable to perform axial alignment between the two lenses by using a mechanical rotary axial alignment mechanism rather than a commonly used rotary lens.

Various forms are applicable when exposure is actually performed by the exposure system formed by using this embodiment. For example, to perform alignment it is possible to use a method by which a mark position on the substrate 11 is detected and stored by previously scanning the substrate stage 17 and the substrate 11 and the mask 9 are aligned on the basis of the stored mark position when exposure is actually performed. It is also possible to use a method by which the mark position and the focal point in a region to be exposed immediately after the preceding region are constantly detected during exposure and exposure is performed by applying feedback, or a method by which the mark position on the substrate 11 is detected for each chip and exposure is performed by performing alignment for each chip.

As the illuminating system 8, it is possible to apply a method which illuminates an elongated band-like region by performing deflection at a high speed by using a beam source having a point-like sectional shape, or a method which uses a beam source having a linear sectional shape by enlarging it. It is also possible to use a method which forms an elongated band-like region by using a beam source having a two-dimensionally extended sectional shape by cutting a portion of the beam source by a selector aperture.

Figure 9:
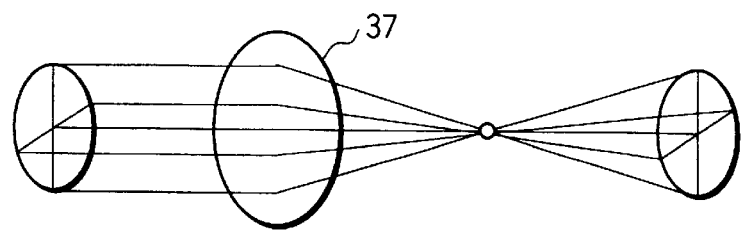
FIG. 9 is a view for explaining an optical system using a lens.

Also, the combination of the lens of this embodiment and the quadrupole lens has the following effect. That is, as shown in FIG. 9, when a beam is converged into a point on, e.g., a rear focal plane in a common charged particle optical system, the beam is known to blur due to the influence of the interaction between particles. This effect is particularly notable when the beam current is large and hence is a large obstacle to an improvement of the throughput.

Figure 10:
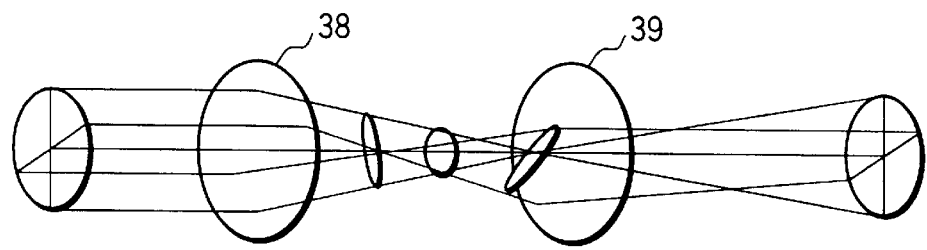
FIG. 10 is a view for explaining an optical system using a lens.

The rear focal planes in the r- and z-axis directions of the lens of this embodiment, however, can be largely shifted by adjusting the lens design, and this shift can be again adjusted easily on the plane to be exposed by using a quadrupole lens. Therefore, as shown in FIG. 10, the lens can be so designed as to avoid a beam from being converged into a single point. As a consequence, any blur of the beam can be kept small even when the beam current is increased, so the throughput can be increased while high resolution is maintained.

In this embodiment, a lens is designed on the basis of common classical mechanics and electromagnetics. However, relativistic correction is necessary if the energy of the charged particle beam is large, e.g., if the energy exceeds about 100 kV in the case of electrons. Strictly speaking, the problem must be formulated by solving a Dirac equation, but this work is complex and not so practical. In calculating the range of a result, e.g., the focal length, required in this embodiment, however, approximation is possible with enough accuracy by replacing mass m with $m/(1-\gamma)^{1/2}$ (where $\gamma=(v/c)^2$, v: velocity, c: speed of light) in each equation described earlier.

(Second Embodiment)

In the first embodiment described above, a lens is formed by using only an electric field. However, the present invention can also be practiced by using a magnetic field. For example, a practical case is when the r and z components of a vector potential A are 0 and its θ component is represented by equation (25) similar to equation (1).

As can be readily calculated, the potential of this equation (25) satisfies a Laplace's equation ($\Delta A=0$). This demonstrates that this potential is valid. As in the above embodiment, when an electron (electric charge q=−e, rest mass=$m_0$) with kinetic energy E is incident on this lens in a direction parallel to the θ axis, the equations of motion are represented by equations (26), (27), and (28).

Accordingly, the same solutions as when e is replaced with $e(2E/m_0)^{1/2}$ in the above embodiment are obtained for θ and z. For r, equations (29) and (30) are obtained following the same procedure as in the above embodiment.

Also, equations relating to the focal position are obtained as equations (31) and (32) following the same procedure as in the above embodiment.

It is evident from equation (30) that $\alpha>0$ and $\alpha^2 \geq (4k/e)(m_0E/2)^{1/2}$ must be satisfied to allow $r_0$ to have a positive solution. Consequently, equation (33) is obtained.

As can be seen from equation (31), however, an optical element does not function as a lens when $r_0 \geq 3\alpha/4k$, so this solution must be excluded. Equations (31) and (32) indicate that a lens symmetrical with respect to r and z can be obtained when the lens is designed to satisfy $5\,kr_0=3\alpha$.

A lens is actually manufactured on the basis of the above results by exploiting the fact that a magnetic field B based on the vector potential given by equation (25) can be defined by a magnetic scalar potential $\phi m$ of equation (34).

The section of an equal magnetic potential plane represented by equation (34) is obtained by shifting a hyperbola $rz=c$ by $\alpha/k$ parallel to the r axis. Therefore, a desired lens can be formed by forming magnetic poles with this shape and applying magnetic fields by coils so that four adjacent magnetic poles alternatively have opposite polarities.

Figure 6:
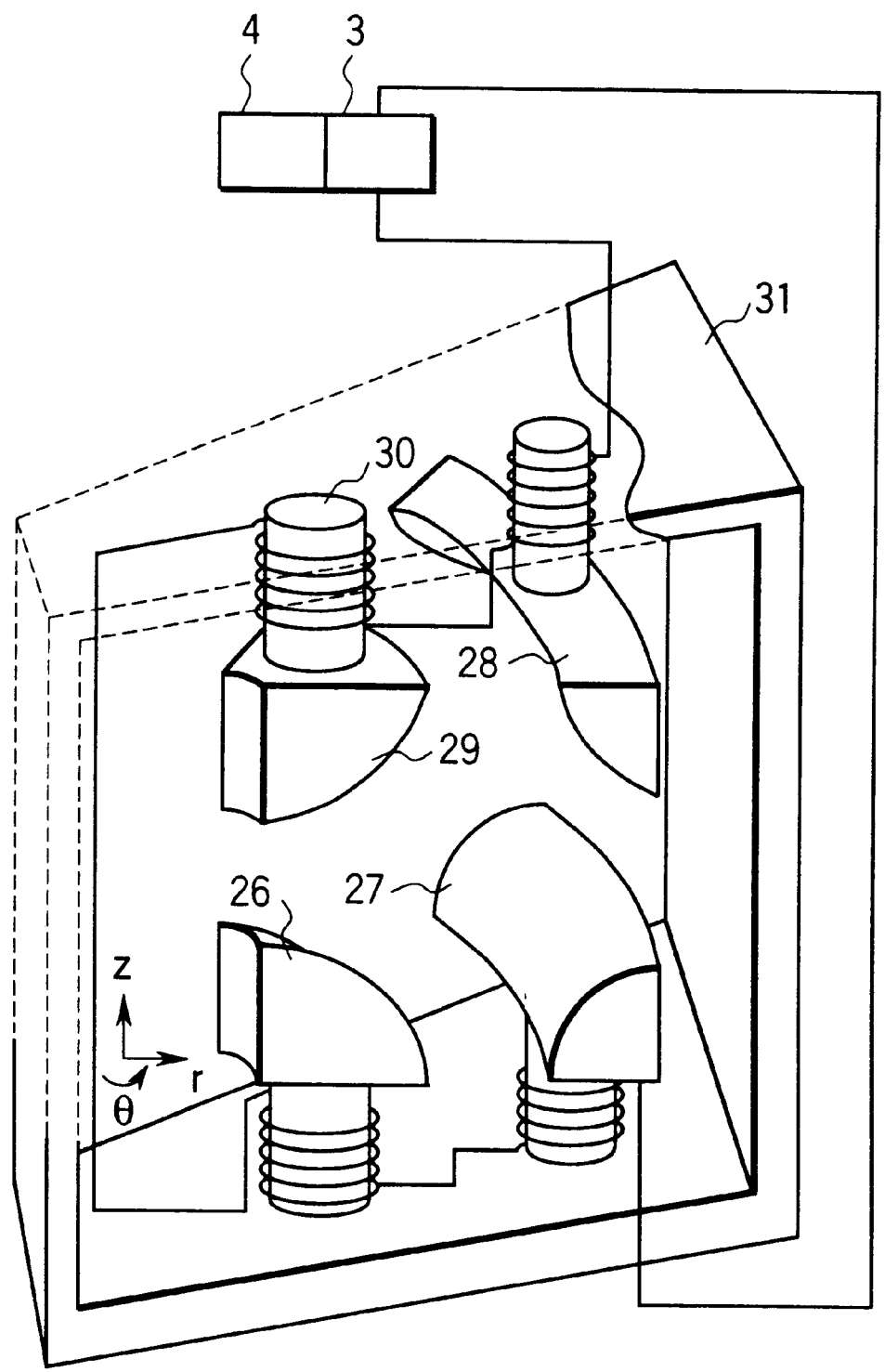
FIG. 6 is a perspective view showing the basic arrangement of an electron-beam lens according to the second embodiment of the present invention.
Figure 7:
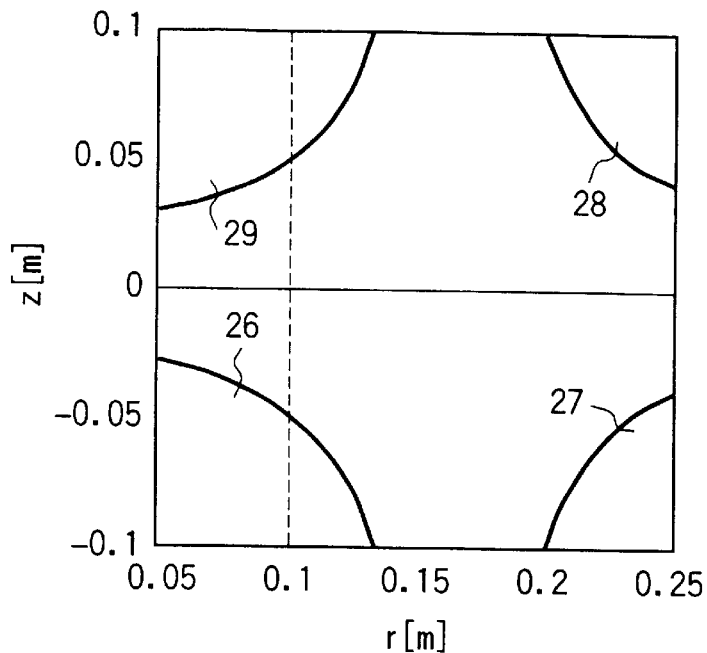
FIG. 7 is a schematic view for explaining the surface shape of the lens of the second embodiment.

FIG. 6 is a schematic view of an electron-beam lens according to the second embodiment of the present invention. This lens is constituted by four magnetic poles 26, 27, 28, and 29. As shown in FIG. 7, the inner walls of these magnetic poles 26, 27, 28, and 29 are so processed as to have shapes given by equations (35), (36), (37), and (38), respectively.

A coil 30 for applying a magnetic field is provided for each magnetic pole. Magnetic fields are so applied that the magnetic poles 26 and 28 are N poles and the magnetic poles 27 and 29 are S poles. A magnetic member 31 for forming magnetic paths is arranged outside the magnetic poles. This magnetic member 31 also serves as a magnetic shield against any external magnetic field.

As a modification of this embodiment, a lens can also be formed by using a total of three magnetic pole members by constituting the magnetic poles 27 and 28 with a single member whose inner wall has columnar surface $r=\alpha/k$.

A lens was designed on the basis of the above calculation results. As an example, magnetic poles are so formed that $-C_1/2k=-C_1/2\alpha=-C_3/2k=-C_3/2\alpha=C_2/2k=C_2/2\alpha=C_4/2k=C_4/2\alpha=\frac{1}{300}\,[m^2]$ in equations (35) to (38), and a coil current is so set that k=0.0253 T/m and $\alpha=4.22\times10^{-3}$ T in equation (25). Consequently, a lens center $r_0=0.10$ m for an electron with an energy of 10 keV. When a lens is designed such that $\theta e=30°$, the focal lengths are 0.109 m in both the r and z directions. Additionally, a field size of about 100 mm can be ensured in the z direction.

By using the lenses of this embodiment, an exposure system similar to that shown in FIGS. 3 to 5 can be obtained. That is, by using the lenses of this embodiment as the lenses 14a and 14b shown in FIGS. 3 to 5, an exposure system basically the same as that of the first embodiment can be obtained. Also, various forms as explained previously are applicable when exposure is actually performed by using this exposure system. Furthermore, the effect as explained earlier can be obtained by combining the lenses of this embodiment and quadrupole lenses.

Figure 11:
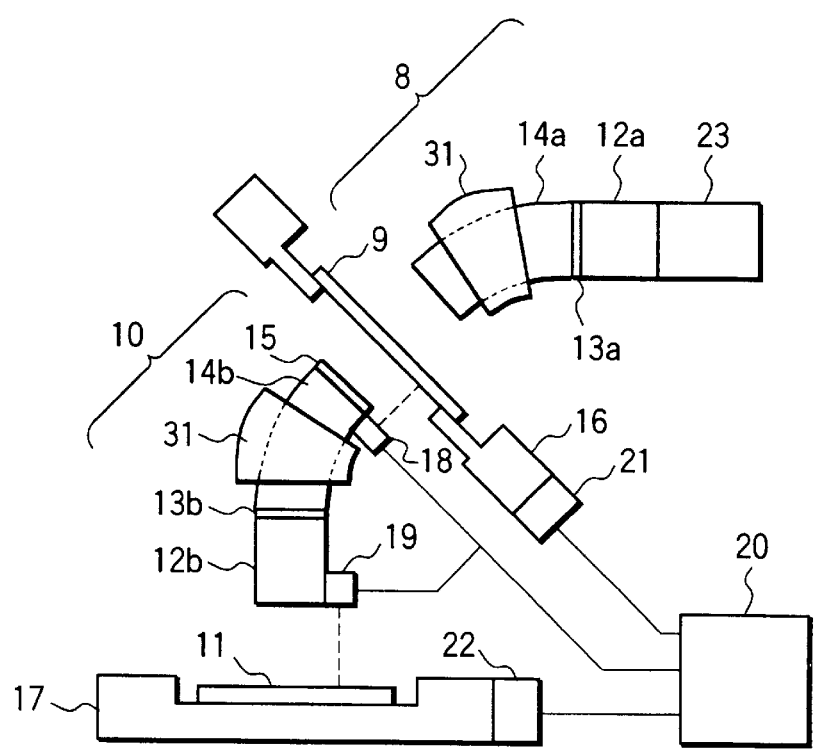
FIG. 11 is a view showing an exposure system according to the second embodiment of the present invention.

FIG. 11 is a view showing the arrangement of an exposure system constituted by using the lenses of this embodiment. The basic constituent elements are equal to those of a so-called scanning exposure apparatus using ultraviolet radiation as a light source. That is, the system comprises a beam source 23, an illuminating optical system 8, a mask 9, a projecting optical system 10, a substrate 11 to be exposed, and alignment mechanisms 18 and 19.

Figure 12:
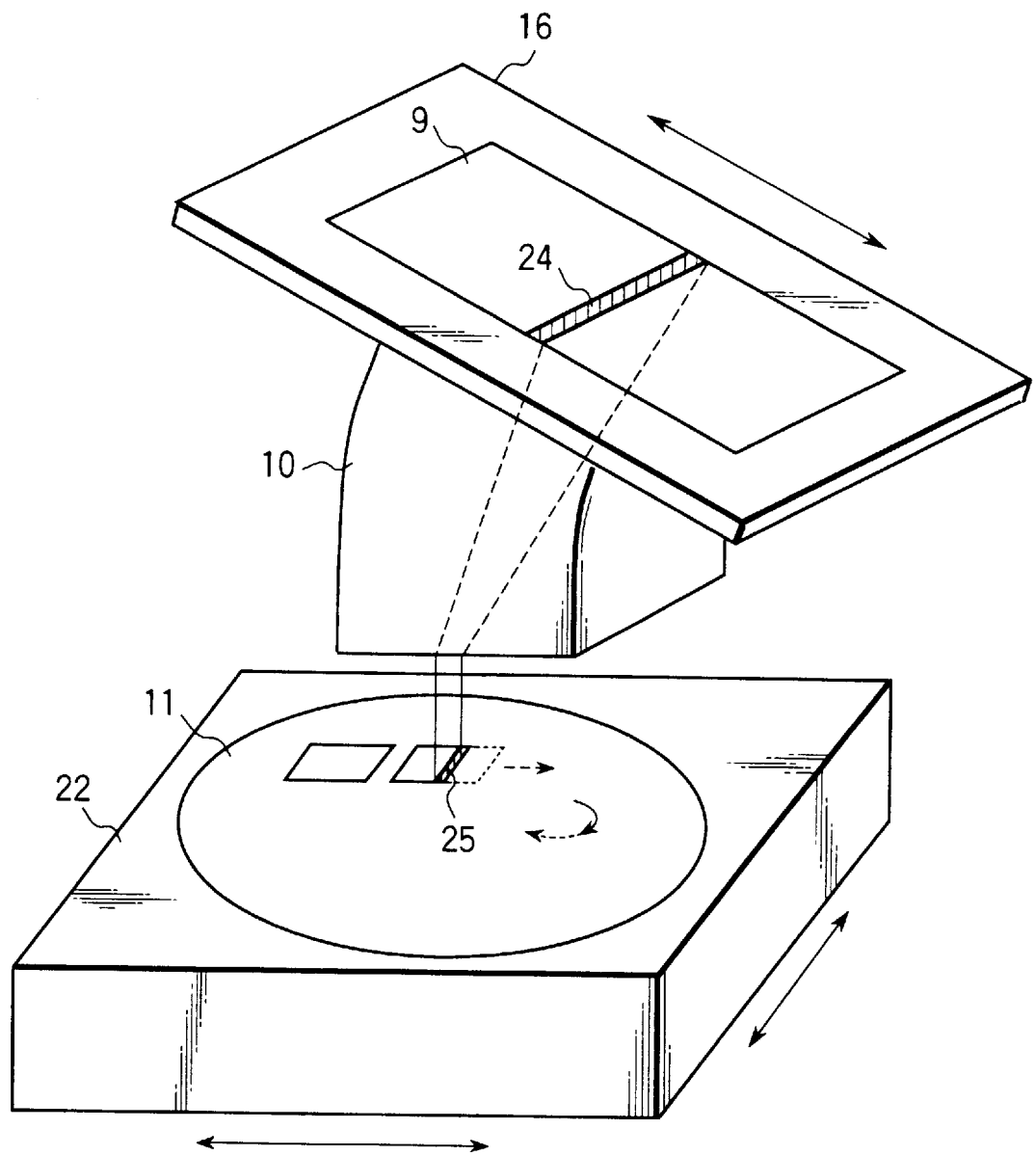
FIG. 12 is a perspective view showing an exposure (transfer) region in the second embodiment.

When exposure (transfer) is actually performed, as schematically shown in FIG. 12, the mask 9 and the substrate 11 are moved in an aligned state in synchronism with each other to scan elongated band-like exposure (transfer) regions 24 and 25, thereby exposing (transferring) the whole region to be exposed (transferred).

Figure 13:
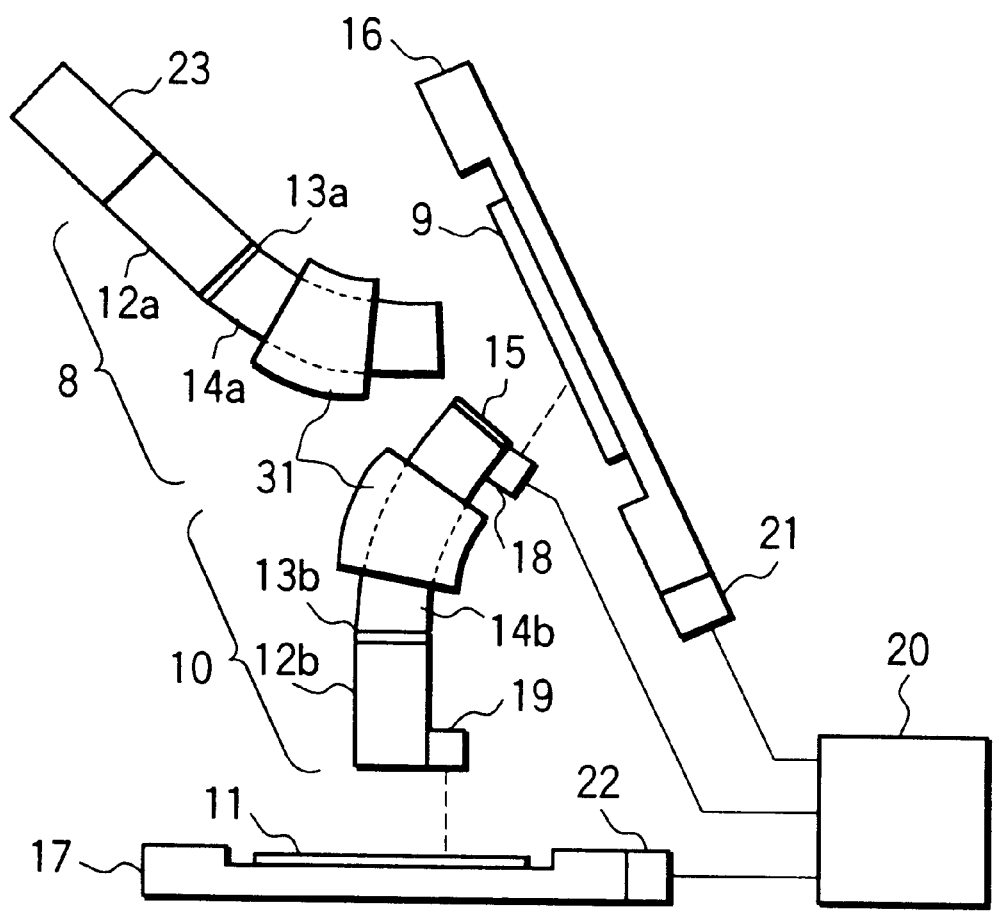
FIG. 13 is a view showing the arrangement of another exposure system using the lens of the second embodiment.

Although a so-called transmitting mask is used as the mask in FIG. 11, a reflecting mask can also be used as shown in FIG. 13. Since the lenses of this embodiment are not axially symmetrical, this exposure system includes quadrupole lenses for correcting defocusing in the r- and z-axis directions and a correcting electrode for performing energy correction, in addition to the common alignment lenses for axial adjustment.

By combining these lenses, axial adjustment can be electrically readily performed even when mechanical adjustment is imperfect. To perform axial alignment in the rotational direction between the lens of this embodiment and the quadrupole lens, a generally used rotary lens can be used. However, to fully utilize the advantages of small aberrations and a large field as the characteristic features of the present invention, it is desirable to perform axial alignment between the two lenses by using a mechanical rotary axial alignment mechanism rather than a commonly used rotary lens.

Various forms are applicable when exposure is actually performed by the exposure system formed by using this embodiment. For example, to perform alignment it is possible to use a method by which a mark position on the substrate 11 is detected and stored by previously scanning the substrate stage 17 and the substrate 11 and the mask 9 are aligned on the basis of the stored mark position when exposure is actually performed. It is also possible to use a method by which the mark position and the focal point in a region to be exposed immediately after the preceding region are constantly detected during exposure and exposure is performed by applying feedback, or a method by which the mark position on the substrate 11 is detected for each chip and exposure is performed by performing alignment for each chip.

As the illuminating system, it is possible to apply a method which illuminates an elongated band-like region by performing deflection at a high speed by using a beam source having a point-like sectional shape, or a method which uses a beam source having a linear sectional shape by enlarging it. It is also possible to use a method which forms an elongated band-like region by using a beam source having a two-dimensionally extended sectional shape by cutting a portion of the beam source by a selector aperture.

Also, the combination of the lens of this embodiment and the quadrupole lens has the following effect. That is, as shown in FIG. 9, when a beam is converged into a point on, e.g., a rear focal plane in a common charged particle optical system, the beam is known to blur due to the influence of the interaction between particles.

This effect is particularly notable when the beam current is large and hence is a large obstacle to an improvement of the throughput. However, the rear focal planes in the r- and z-axis directions of the lens of this embodiment can be largely shifted by adjusting the lens design, and this shift can be again adjusted easily on the plane to be exposed by using the quadrupole lens. Therefore, a lens can be so designed as to avoid a beam from being converged into a single point (FIG. 10).

As a consequence, any blur of the beam can be kept small even when the beam current is increased, so the throughput can be increased while high resolution is maintained.

In this embodiment, a lens is designed on the basis of common classical mechanics and electromagnetics. However, relativistic correction is necessary if the energy of the charged particle beam is large, e.g., if the energy exceeds about 100 kV in the case of electrons. Strictly speaking, the problem must be formulated by solving a Dirac equation, but this work is elaborate and not so practical.

In calculating the range of a result, e.g., the focal length, required in the present invention, however, approximation is possible with enough accuracy by replacing mass m with $m/(1-\gamma)^{1/2}$ (where $\gamma=(v/c)^2$, v: velocity, c: speed of light) in each equation described earlier.

Principal aberration of the lens of this embodiment results from high-order terms omitted in series expansion used in introducing equations (8) and (29). When the expansion used in obtaining equation (8) is performed to the next term, equation (39) is obtained. When equation (13) is used by using an electron as a charged particle as in the first embodiment, equation (40) is obtained.

Accordingly, it is desirable to design a lens so as to decrease the absolute value of the second term on the right side of this equation (40) as long as other conditions permit. However, equations (8) and (13) show that $2<e\alpha/E<4$ must be satisfied to allow an optical element to function as a lens. Therefore, this second term cannot be completely decreased to 0.

Analogously, equation (41) is obtained by the expansion used in obtaining equation (29). As in the above case, it is also desirable to design a lens so as to decrease the absolute value of the second term on the right side of this equation (41). In this case using a magnetic field, it is obvious from equation (31) that $3\alpha/r_0-4k>0$ must be satisfied to allow an optical element to function as a lens. Therefore, this second term cannot be completely decreased to 0.

Figure 14:
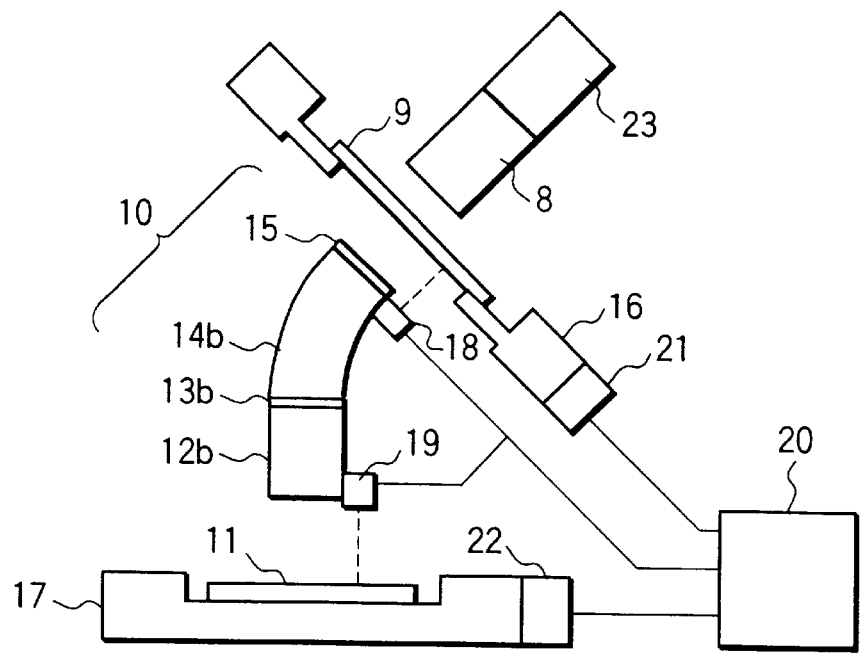
FIG. 14 is a view showing the arrangement of still another exposure system using the lens of the second embodiment.
Figure 15:
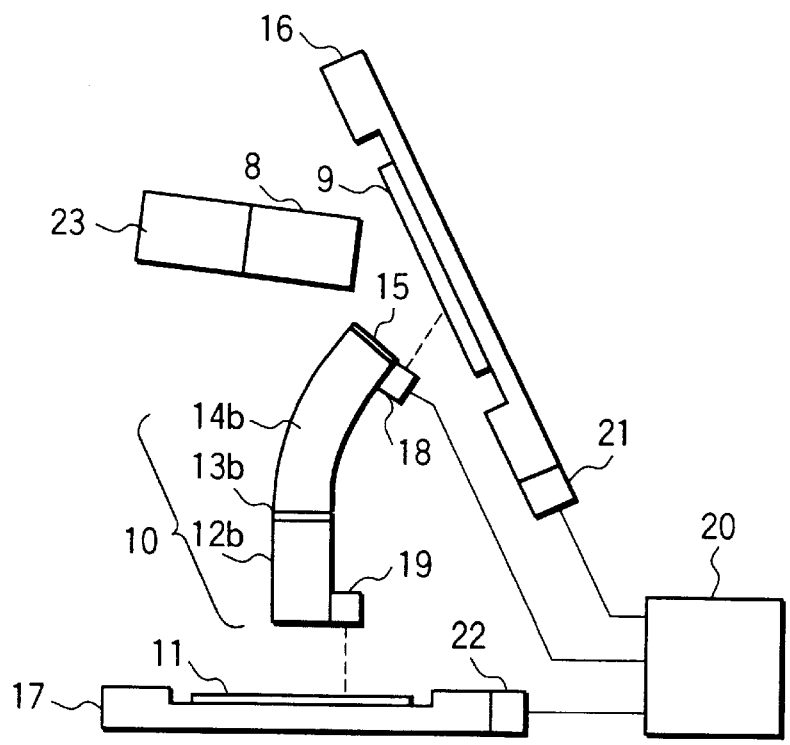
FIG. 15 is a view showing the arrangement of still another exposure system using the lens of the second embodiment.

FIGS. 14 and 15 show another embodiment of the exposure apparatus constituted by using the present invention. In the previous embodiments, an electron beam is also used in the illuminating system. This embodiment is characterized in that ultraviolet radiation or X-rays are irradiated on a mask and an image is formed by using photoelectrons generated by the mask.

The basic constituent elements are similar to those of the previous embodiments. That is, the system includes a beam source 23, an illuminating optical system 8, a mask 9, a projecting optical system, a substrate 11 to be exposed, alignment mechanisms 18 and 19, and the like.

A pattern portion and a non-pattern portion of the mask are made from materials having different photoelectron generation efficiencies. Accordingly, pattern formation is performed by using the contrast of photoelectrons generated when light is irradiated.

Also, a bias voltage can be applied to the mask to enhance this photoelectron contrast. As in the previous embodiments, when exposure (transfer) is actually performed, as schematically shown in FIG. 12, the mask 9 and the substrate 11 are moved in an aligned state in synchronism with each other to scan elongated band-like exposure (transfer) regions 24 and 25, thereby exposing (transferring) the whole regions to be exposed (transferred).

Although a so-called transmitting mask is used as the mask in FIG. 14, a reflecting mask can also be used as shown in FIG. 15.

(Third Embodiment)

A charged particle beam exposure apparatus according to the third embodiment of the present invention will be described below.

The shape of a charged particle beam used in exposure in the charged particle beam exposure apparatuses of the previous embodiments is largely different from that in conventional apparatuses. Accordingly, a method of adjusting these charged particle beam exposure apparatuses is also different.

In this embodiment, this charged particle beam exposure apparatus adjusting method will be described.

Figure 16:
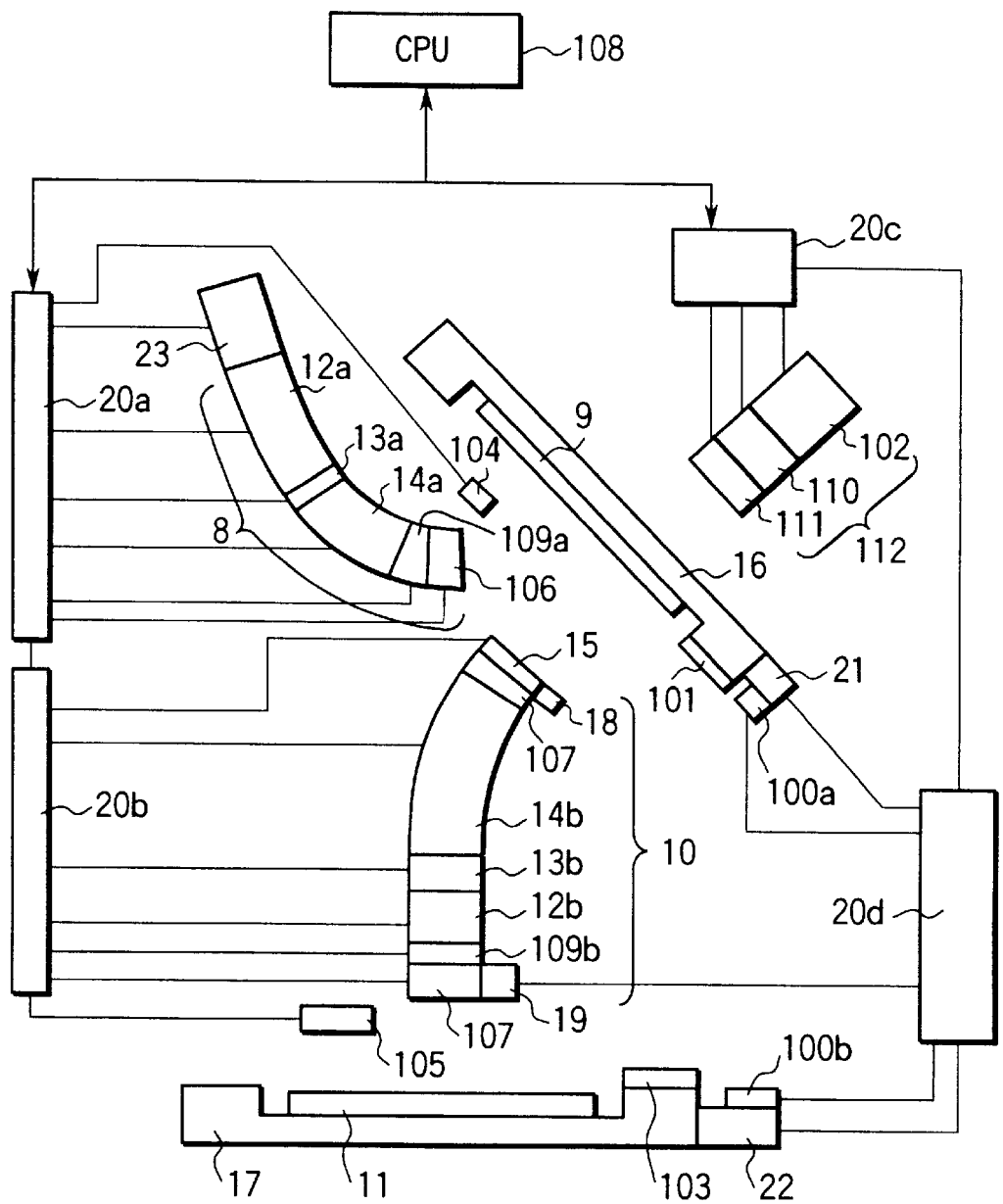
FIG. 16 is a view showing a charged particle beam exposure apparatus according to the third embodiment of the present invention.

FIG. 16 is a view showing a charged particle beam exposure apparatus according to the third embodiment of the present invention. In FIG. 16, the same reference numerals as in FIG. 13 denote the same parts, and a detailed description thereof will be omitted. That is, only different portions will be described below.

Mark holders 101 and 103 holding a mark and a Faraday cup are attached to a mask stage 16 and a substrate stage 17, respectively.

These mark holders 101 and 103 can be selected by respectively moving their stages. Also, the positions of the mark stages 101 and 103 can be accurately controlled by a mask stage control mechanism 21 and a substrate stage control mechanism 22 including laser measuring systems 100a and 100b, respectively, exposure apparatus control systems 20a, 20b, 20c, and 20d, and a control computer (CPU) 108.

Reference numerals 14a and 14b denote large-field lenses explained in the previous embodiments.

In addition to the stage control described above, the exposure apparatus control systems 20a, 20b, 20c, and 20d and the control computer (CPU) 108 control the individual optical system constituent elements, process and control detection signals from detectors, and control the whole exposure apparatus.

The optical system of the charged particle beam exposure apparatus explained in each of the above embodiments can be classified into the illuminating optical system for irradiating a beam onto a mask 9 and the projecting optical system for projecting the beam reflected by the mask 9 onto a substrate 11 to be exposed.

The first characteristic feature of this embodiment is that a third optical system 112 for beam adjustment is added to the above two optical systems.

As shown in FIG. 16, this beam adjusting optical system 112 includes a beam adjusting beam source 102, a charged beam forming mechanism 110, and a lens+beam alignment mechanism 111.

In FIG. 16, reference numerals 104 and 105 denote detectors; 106 and 107, beam alignment mechanisms; and 109a and 109b, beam deflecting mechanisms.

In common exposure apparatuses, both an illuminating optical system and a projecting optical system are adjusted by using a charged beam emitted from a beam source 23.

The charged particle beam exposure apparatus of this embodiment, however, uses a unique arrangement in which a beam irradiated on the mask 9 by an illuminating optical system 8 is reflected and irradiated on a projecting optical system 10.

In an optical system like this, especially when the projecting optical system 10 is to be adjusted, it is very difficult to accurately perform beam adjustment on the optical axis or in the focal position because the shape and intensity of the charged beam reflected by the mask 9 are complicated.

In this embodiment, therefore, the third optical system 112 including the beam source 102 for adjusting the projecting optical system is arranged on the side of the mask stage 16 away from the side on which the projecting optical system 10 is arranged.

By using this adjusting optical system 112, the projecting optical system is adjusted independently and finally finely adjusts the two optical systems as a single optical system. This makes highly accurate pattern drawing possible.

A method of adjusting the charged particle beam exposure apparatus according to this embodiment will be described below. Several methods are usable as practical adjustment procedures.

Figure 17:
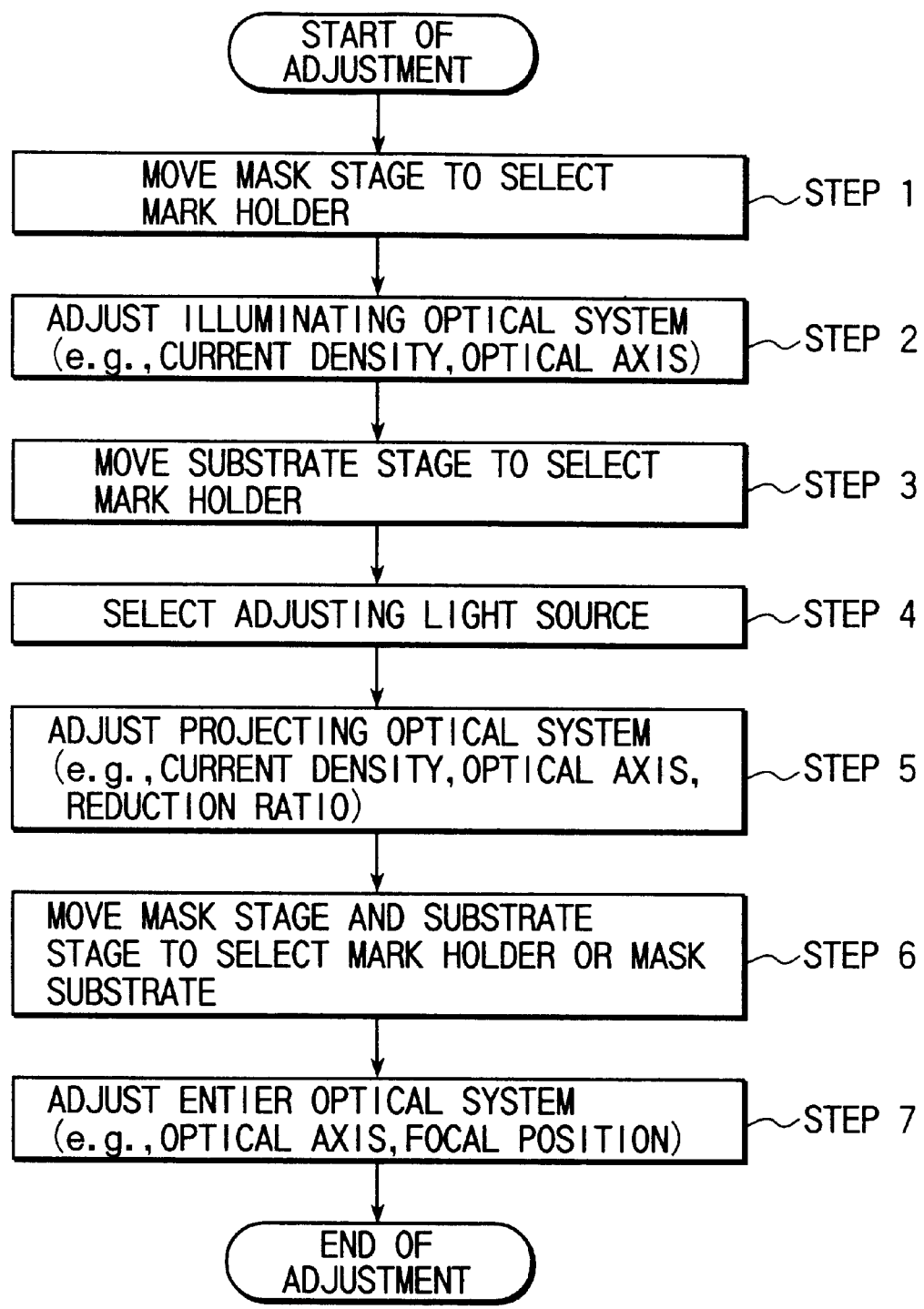
FIG. 17 is a flow chart for explaining a method of adjusting the charged particle beam exposure apparatus of the third embodiment.

FIG. 17 shows the beam adjustment procedure of the charged particle beam exposure apparatus of this embodiment.

First, to adjust the illuminating optical system 8, the mask stage 16 is moved to select the mark holder 101 by using the mask stage control mechanism 21 (Step 1).

A heavy metal mark for measuring the beam size or the beam position and a Faraday cup for measuring the beam current are attached to the mark holder 101. On the basis of these measured values, the optical axis of the lens and the current density can be adjusted (Step 2).

More specifically, to adjust the beam size, the beam position, or the beam resolution, the beam deflecting mechanism 109a is used to scan the beam on the heavy metal mark, and the reflected electrons are detected by the detector 104.

An electromagnetic deflector or an electrostatic deflector can be used as the beam deflecting mechanism 109a. The beam current can be measured by irradiating the beam onto the Faraday cup.

Note that the material and shape of the mark for measuring the beam size and the beam position are not particularly limited to those of the heavy metal mark described above as long as the mark can accurately detect the beam shape and the mark shape. Additionally, the object to be detected by the detector 104 is not limited to the reflected electrons but can be any of secondary electrons, a current flowing through the mark, and an energy beam such as X-rays.

Next, to adjust the projecting optical system 10, the substrate stage 17 is moved to select the mark holder 103 (Step 3).

The beam source 102 for adjusting the projecting optical system is then selected (Step 4). In this step it is necessary to electrically or mechanically intercept a charged beam emitted from the beam source 23 so that the beam does not reach the mask stage 16. The mask stage 16 is moved to a position which does not interrupt the beam from the third optical system.

The beam adjusting optical system 112 has a function of irradiating a beam similar to the band-like beam reflected by the mask, in addition to a rectangular or circular beam. Also, the beam adjusting optical system 112 includes a lens and a beam alignment mechanism 111 in order to irradiate an appropriate beam on the projecting optical system.

A heavy metal mark for measuring the beam size and the beam position and a Faraday cup for measuring the beam current are attached to the mark holder 103. On the basis of these measured values, the optical axis of the lens and the current density can be adjusted (Step 5).

More specifically, to adjust the beam size, the beam position, the beam resolution, or the reduction ratio, the beam deflecting mechanism 109b is used to scan the beam on the heavy metal mark, and the reflected electrons are detected by the detector 105.

An electromagnetic deflector or an electrostatic deflector can be used as the beam deflecting mechanism 109a. The beam current can be measured by irradiating the beam onto the Faraday cup.

Note that the material and shape of the mark for measuring the beam size and the beam position are not particularly limited to those of the heavy metal mark described above as long as the mark can accurately detect the beam shape and the mark shape.

Additionally, the object to be detected by the detector 104 is not limited to the reflected electrons but can be any of secondary electrons, a current flowing through the mark, and an energy beam such as X-rays.

After the adjustments of the illuminating optical system 8 and the projecting optical system 10 are complete, the operation of the projecting optical system adjusting beam source 102 is stopped, and the beam source 23 is used to perform beam adjustment for the entire optical system (Step 7).

In this beam adjustment of the entire optical system, the optical axis, the current density, the beam size, the beam rotating direction, and the focal position are finely adjusted.

The adjustment of the whole optical system is performed by selecting the mark holders 101 and 103 by moving the mask stage 16 and the substrate stage 17 (Step 6). Alternatively, the beam adjustment can be performed by selecting a beam adjusting mask attached to the mask stage 17 and using the beam reflected by this beam adjusting mask.

It is desirable that the trajectory of the beam irradiated on the projecting optical system 10 by the adjusting optical system 112 match the trajectory of the beam emitted from the illuminating optical system 8, reflected by the mask 9, and irradiate on the projecting optical system 10.

In this embodiment, the beam alignment mechanisms 106 and 111, for example, can be used to match the trajectory of the beam irradiated on the projecting optical system 10 by the adjusting optical system 112 with the trajectory of the beam reflected by the mask 9 and irradiate on the projecting optical system 10.

Even when the orbits of the two beams do not match, these orbits can be matched by using the beam alignment mechanisms 106 and 107 after the illuminating optical system 8 and the projecting optical system 10 are adjusted.

As normal beam adjustment, it is enough to perform only the beam adjustment of the whole optical system. After the apparatus is started up, for example, it is sometimes necessary to separately adjust the illuminating optical system and the projecting optical system. The adjustments of the illuminating optical system and the projecting optical system can be performed not only after the start-up of the apparatus but also at any arbitrary timing.

The second characteristic feature of this embodiment is that the apparatus has a function of matching the optical axes of the illuminating optical system 8 and the projecting optical system 10.

When exposure is performed by using the exposure apparatus shown in FIG. 16, drawing is performed by moving the mask stage 16 and the substrate stage 17 in synchronism with each other. Therefore, once the optical axes are matched, they do not move during exposure.

When, however, the beam irradiation position on the mask stage 16 is scanned by a deflector or the like while the mask stage 16 is used, the incident angle or position of the beam to the projecting optical system 10 changes due to the beam irradiation position. As a consequence, the position of the exposed pattern can change or the resolution of the pattern can deteriorate.

Accordingly, when the beam irradiation position changes on the mask such as when the beam irradiation position on the mask stage 16 is to be scanned by a deflector or the like, the beam alignment mechanisms 106 and 107 are moved in synchronism with the beam irradiation position or the beam deflecting mechanism. Consequently, the optical axes of the illuminating optical system and the projecting optical system 10 can be constantly matched with each other.

More specifically, when the beam is deflected by the beam deflecting mechanism 109a, for example, the control amount of the alignment mechanism 107, with which the optical axes of the illuminating optical system 8 and the projecting optical system 10 match, is calculated on the basis of the deflection amount of the beam deflected by the beam deflecting mechanism 109a.

On the basis of this control amount, the beam alignment mechanism 107 is controlled. Consequently, the optical axes of the illuminating optical system 8 and the projecting optical system 10 can be matched with each other.

Note that the beam alignment mechanism can be an electrical mechanism using an electromagnetic coil or an electrostatic deflector or can perform adjustment by mechanically moving an optical system. With the use of this beam alignment mechanism, the beam incident axis to the projecting optical system can be held constant at all times, and this further increases the accuracy.

The third characteristic feature of this embodiment is that the reduction ratio or the current density can be selected in accordance with the accuracy of the pattern to be drawn.

The transfer exposure apparatus of this embodiment exposes large and small patterns at once. Generally, as the dimensions of patterns decrease, the required pattern dimensional accuracy increases. Accordingly, the mask 9 must also be manufactured with high accuracy.

When the pattern of the mask 9 is reduced and transferred onto the substrate 11 to be exposed, the reduction ratio (=dimensions on the mask/dimensions on the substrate to be exposed) increases. This increases the ratio at which dimensional errors on the mask are reduced compared to a case in which the reduction ratio is small. Consequently, errors on the substrate decrease to increase the margin of the mask manufacturing accuracy.

When the reduction ratio is increased, however, the size of the entire mask must be increased to hold the size of the region to be transferred at once equal to that when the reduction ratio is small. To maintain the throughput, therefore, a larger beam must be used.

Accordingly, patterns not requiring high dimensional accuracy are drawn at a decreased reduction ratio, and patterns requiring high accuracy are drawn at an increased reduction ratio. The use of this method makes high-accuracy, high-speed drawing feasible. Masks having different dimensions and different processing accuracies are prepared in accordance with the individual exposure reduction ratios and selectively used in exposure.

More specifically, if pattern dimensional accuracies required in the same layer are largely different, drawing is first performed on a substrate to be exposed by using a mask having a small reduction ratio. Subsequently, drawing is again performed on the same substrate by replacing the mask with a mask having a large reduction ratio.

Different masks can be positioned by measuring the positions of the masks by using a laser measuring system. Alternatively, a position mark pattern is previously formed on a mask, and the mask is positioned by measuring the position of the mark pattern with a beam.

It is also possible to perform drawing on two or more substrates to be exposed by preparing a plurality of optical systems having different reduction ratios. If this is the case, it is desirable to provide a plurality of optical systems for one substrate stage. Consequently, the mask selection time or the optical system adjustment time can be shortened compared to a case in which one optical system is used.

With the above function, high-accuracy pattern exposure can be performed at high speed.

The above embodiment uses projecting optical systems having different reduction ratios. However, it is also possible to prepare optical systems having different current densities and perform drawing while controlling the beam resolving power.

In the above embodiment, the method of performing drawing by changing the reduction ratio or the current density in the same layer is described. However, the reduction ratio or the current density can also be changed between a plurality of layers.

In this embodiment, the method of adjusting the optical system of a reflecting exposure apparatus is described. However, a similar adjusting method can be performed for a transmitting exposure apparatus. In the case of a transmitting exposure apparatus, the projecting optical system can be adjusted by using an illuminating optical system as an adjusting optical system.

This embodiment is explained by taking an electron beam drawing apparatus as an example. However, the present invention is also applicable to an ion beam drawing apparatus or a charged beam drawing apparatus.

This embodiment, therefore, can provide a charged particle optical system adjusting method in which aberrations do not extremely increase even when the field size is increased. As a consequence, a high-accuracy, high-speed charged beam exposure apparatus can be provided.

(Fourth Embodiment)

In the charged particle beam exposure apparatuses of the above embodiments, if the travel of the mask stage or the wafer stage fluctuates, the resolution of the transfer pattern deteriorates or the positions of the under layer pattern and the transfer pattern deviate from each other.

A charged particle beam exposure apparatus of this embodiment can correct such fluctuations of the stage travel and as a consequence improves the positioning accuracy.

Also, in the charged particle beam exposure apparatuses of the above embodiments, even if the bottom surface of a wafer is fixed on a flat surface by using a high-accuracy chuck, unavoidable roughness resulting from an uneven wafer thickness exists on the top surface of the wafer. The transfer position accuracy of the pattern sometimes deteriorates under the influence of this surface roughness.

The charged particle beam exposure apparatus of this embodiment can extremely decrease this influence.

Furthermore, in the charged particle beam exposure apparatuses of the above embodiments, if nonlinear distortion occurs on the under layer pattern of a mask or a wafer, the positions of the under layer pattern and transfer pattern deviate from each other.

The charged particle beam exposure apparatus of this embodiment can correct this positional deviation and as a consequence improves the positioning accuracy. This embodiment also provides a beam source having high intensity and high uniformity.

That is, the charged particle beam exposure apparatus of this embodiment can improve the positioning accuracy and perform high-accuracy, high-speed pattern formation in the charged particle beam exposure apparatuses using the charged beam optical elements explained in the above embodiments.

The first characteristic feature of this embodiment relates to the positioning accuracy.

In the manufacture of a semiconductor device, it is commonly necessary to perform exposure processing a plurality of number of times, and the positioning accuracy of each exposure with respect to the under layer which is already exposed to form a pattern must be higher than a predetermined level.

When exposure is performed by using the mask and wafer alignment mechanisms incorporated into the charged particle beam exposure apparatus of any of the above embodiments, however, errors are produced in the travel accuracy (synchronization accuracy) of the mask stage and the wafer stage, positional deviation occurs due to the surface roughness of a wafer, or distortion of the wafer shape is produced by a wafer process. Consequently, to hold the positioning accuracy with respect to the under layer at a desired value or more, it is necessary to improve the accuracy of each component of these mechanisms or introduce new correcting mechanisms.

The second characteristic feature of this embodiment relates to a beam source.

The intensity of a beam source has an effect on the throughput of an exposure apparatus, and the uniformity of the intensity of a beam source is one of important characteristics required of an exposure apparatus. However, in the charged particle beam exposure apparatuses of the above embodiments, the shape of the exposure region largely differs from that used in conventional apparatuses. Accordingly, although it is not impossible to directly use conventionally known beam sources, the use of a beam source with high intensity uniformity and high efficiency is desirable.

The charged particle beam exposure apparatus of this embodiment can perform high-accuracy pattern formation by improving the positioning accuracy and providing a desirable beam source.

Figure 18:
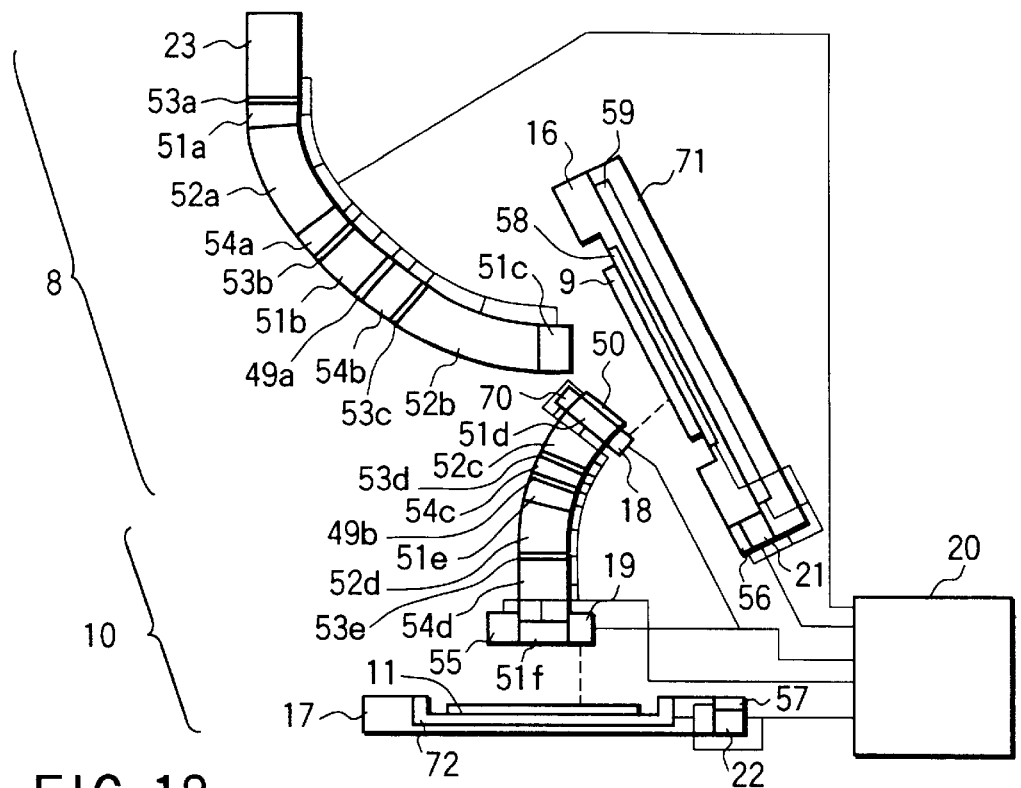
FIG. 18 is a view showing a charged particle beam exposure apparatus using a reflecting mask according to the fourth embodiment of the present invention.
Figure 19:
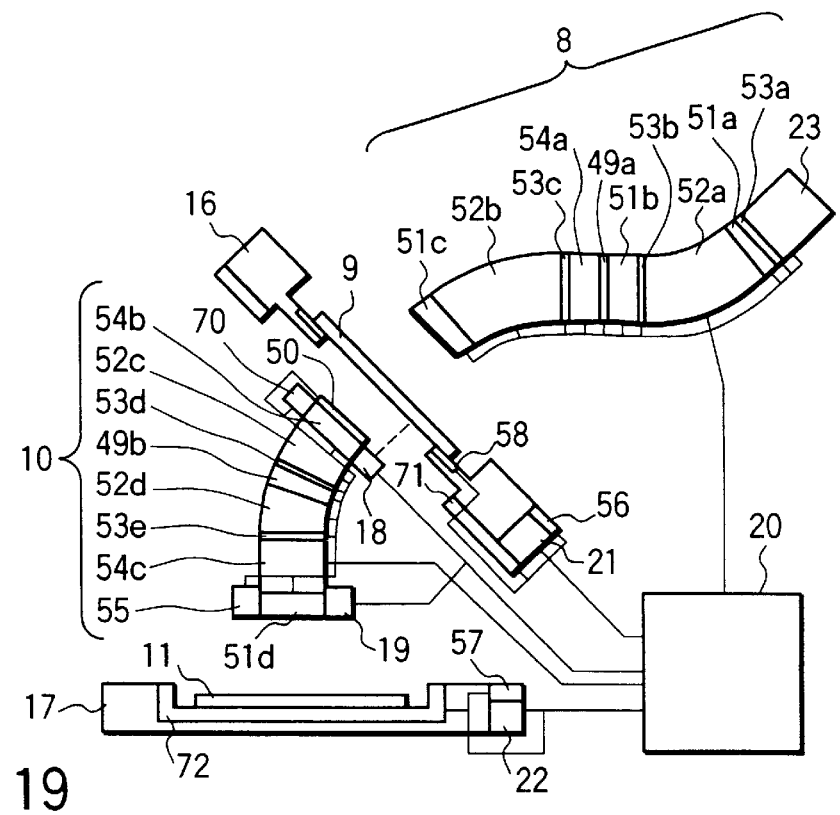
FIG. 19 is a view showing a charged particle beam exposure apparatus using a transmitting mask according to the fourth embodiment.

FIG. 18 is a view showing a charged particle beam exposure apparatus using a reflecting mask according to the fourth embodiment of the present invention. FIG. 19 is a view showing a charged particle beam exposure apparatus using a transmitting mask according to the fourth embodiment of the present invention.

In FIGS. 18 and 19, the same reference numerals as in FIG. 13 denote the same parts. The basic constituent elements shown in FIGS. 18 and 19 are the same as those of a so-called scanning exposure (transfer) apparatus using ultraviolet radiation as a beam source.

In FIGS. 18 and 19, reference numerals 49a and 49b denote apertures; 50, an energy correcting electrode; 51a to 51f, alignment lenses; 52a to 52d, large-field lenses; 53a to 53e, rotary axial alignment mechanisms; 54a to 54d, quadrupole lenses; 55, a substrate surface height measuring mechanism; 56, a mask stage position measuring mechanism; 57, a substrate stage position measuring mechanism; 58, a distortion application mask holding mechanism; and 59, a constant mask temperature setting mechanism.

Reference numeral 70 denotes a mask stage height measuring mechanism; 71, a mask stage inclination/height adjusting mechanism; and 72, a substrate stage inclination/height adjusting mechanism.

The large-field lenses 52a to 52d are for a charged particle beam optical device explained in the first embodiment described earlier. To further decrease aberrations on the side where the beam section is smaller, correcting electrodes are additionally provided near the two open end portions of an electrode to correct the disturbance of an electric field formed in each opening.

An incident beam loses its energy when the beam is transmitted through or reflected by a mask, and this influences the chromatic aberration of the formed image. To prevent this, the correcting electrode 50 for performing energy correction is formed at the end, on the side of a mask, of a projecting optical system.

To effectively utilize energy correction, each optical element, a beam source, and a mask are disconnected from the ground potential, and their potentials can be independently adjusted. Accordingly, signals from control systems for controlling the optical elements, beam source, and mask stage are transmitted through photocouplers. However, since substrates to be exposed are loaded in and out frequently, these substrates are desirably fixed to the ground potential.

Furthermore, when energy correction is performed, it is necessary to correct the intensity of a lens accordingly as can be seen from the fact that the focal length of a lens depends upon the beam energy.

Also, since the optical system of this exposure system is asymmetrical, the apertures 49a and 49b have a rectangular shape or a slit-like shape having semicircles at the two ends, rather than a circular shape of normal apertures.

These apertures cut the outside portions of a beam to prevent any excess load from being applied on a mask due to beam irradiation to unnecessary portions of the mask. These apertures are also used to remove portions where the uniformity of the beam intensity is low or to limit the angle distribution of the beam to improve the image formation contrast.

Since the optical system of this exposure apparatus is asymmetrical, the alignment lenses 51a to 51f are not usual eight-pole lenses having a circular sectional shape, but rather these lenses are constituted by a total of eight electrodes having an elliptical section or a sectional shape close to a rounded rectangle.

Figure 20:
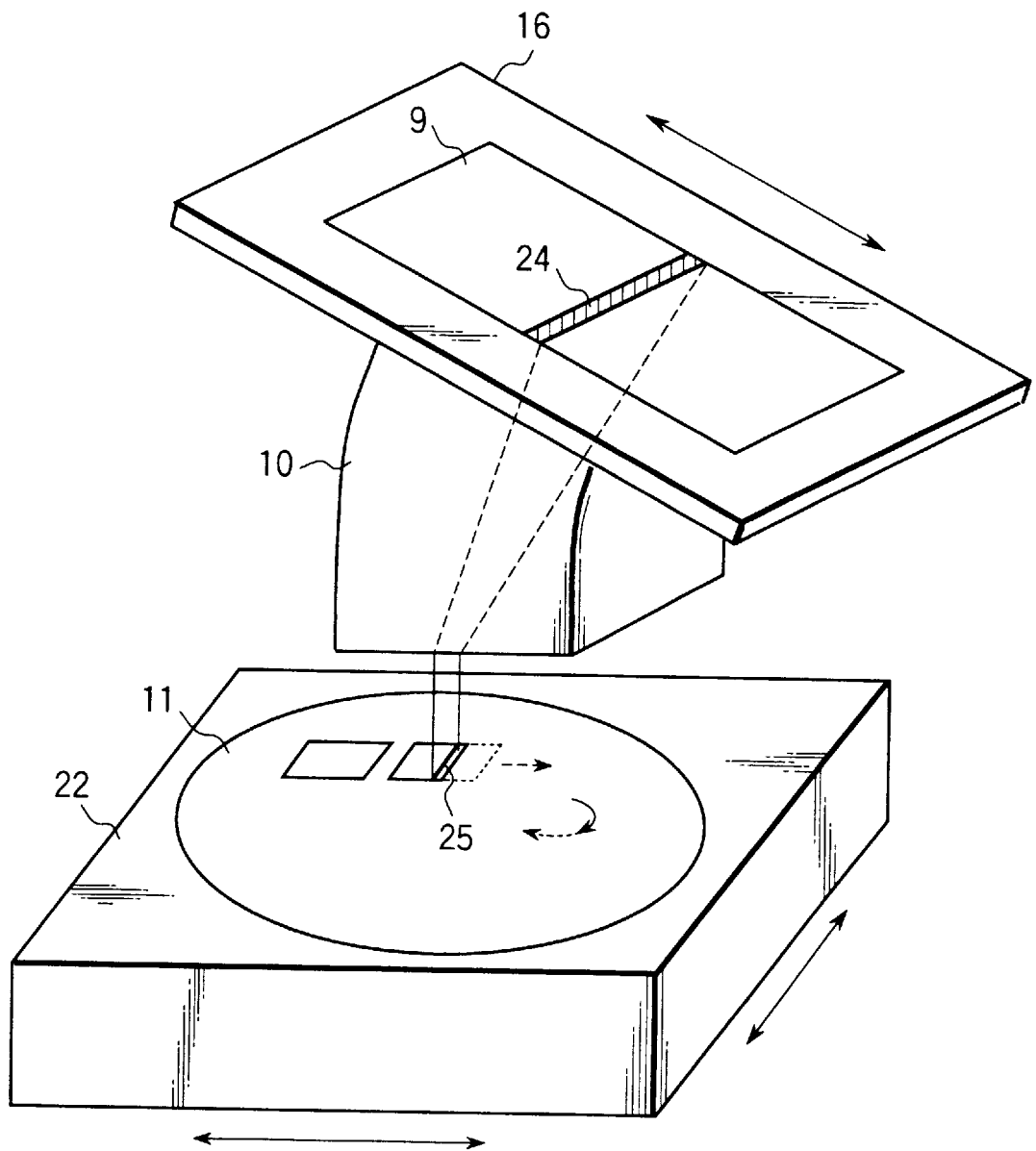
FIG. 20 is a view showing an exposure region in the charged particle beam exposure apparatus of the fourth embodiment.

To control both the inclination and translation of a beam, one alignment lens is constituted by two elements having a deflecting function. In actual exposure (transfer), as shown in FIG. 20, a mask 9 and a substrate 11 to be exposed move in an aligned state in synchronism with each other to scan elongated band-like exposure (transfer) regions 24 and 25, thereby exposing (transferring) the whole region to be exposed (transferred).

A projecting system 10 has a function of finely adjusting, where necessary, the focal position or the transfer magnification during scanning. That is, the projecting system 10 has a mechanism for making appropriate exposure possible even if the surface height of the substrate to be exposed varies or the under layer pattern has a magnification error.

The first characteristic feature of the improvement of this embodiment is to include a mechanism which has the high-accuracy mask stage position measuring mechanism 56 constituted by an x-y biaxial laser interferometer and the high-accuracy substrate stage position measuring mechanism 57 also constituted by an x-y biaxial laser interferometer, and which calculates deviations of the two stages from predetermined positions on the basis of outputs from these mechanisms and, on the basis of the calculation results, performs two-dimensional correction for the alignment lens 51f to correct the beam position on the substrate to be exposed.

In an apparatus having no such mechanism, if the mask stage or the substrate stage produces a travel fluctuation of several tens of nm due to some reason during scanning for pattern transfer, the position of the pattern to be transferred deviates from a desired position. This can deteriorate the positioning accuracy or the pattern resolution.

Since this embodiment introduces the above mechanism, however, even when a travel fluctuation occurs, the amount of the travel fluctuation is measured in real time, and the positional deviation of the transfer pattern caused by this fluctuation is calculated and immediately fed back to the amount of beam deflection by the alignment lens. Consequently, the position of the pattern to be transferred can be controlled to a desired position. Accordingly, it is possible to greatly improve the positioning accuracy and prevent deterioration of the resolution.

Also, this mechanism has the following advantage. In a conventional so-called scanning exposure (transfer) apparatus using ultraviolet radiation as a beam source, if an under layer pattern becomes different from an ideal shape due to various processes or an individual difference of the exposure apparatus when positioning exposure is performed, it is possible to finely adjust the speed of stage scanning for exposure to correct the relative position of the mask and the substrate to be exposed, thereby correcting the transfer size or transfer shape distortion.

In the present invention, the transfer size and transfer shape can be corrected with a similar mechanism. However, finely adjusting the scanning speed of a large stage in a vacuum can induce new errors in the travel accuracy of the stage.

The use of the above mechanism, however, makes it possible to obtain a desired transfer size or transfer shape by correction of the amount of beam deflection by the alignment lens while the stage is driven to travel at a fixed speed. This can further improve the accuracy.

In actual exposure, the sum of a correction value for the transfer size or transfer shape and a correction value based on the stage travel fluctuation described above is preferably corrected by the alignment lens.

Additionally, similar to this mechanism, the deviation of the transfer position on a mask is calculated in accordance with outputs from the mask stage position measuring mechanism 56 and the mask surface height measuring mechanism 70. On the basis of the calculation result, the alignment lens 41c can be corrected so that the transfer position on the mask is constantly properly illuminated.

Consequently, it is possible to prevent an unnecessarily wide region on the mask from being irradiated and prevent an excess load from being applied on the mask.

The second characteristic feature of the improvement of this embodiment is to include a mechanism which has the optical mechanism 55 for measuring the surface height of a substrate to be exposed and a substrate stage 17 having a mechanism for adjusting the inclination of the substrate to the beam optical axis and the vertical position, i.e., the position in the beam-axis direction of the substrate, and which adjusts the inclination and height of the substrate on the basis of the surface height of each transfer region of the substrate.

A wafer is in many instances used as a substrate to be exposed, and the finished shape of a wafer has a thickness unevenness of a few $\mu$m. Therefore, even when the bottom surface of the wafer is held almost completely flat by using a high-quality wafer holding mechanism, a roughness of a few $\mu$m is produced on the top surface.

Figure 21:
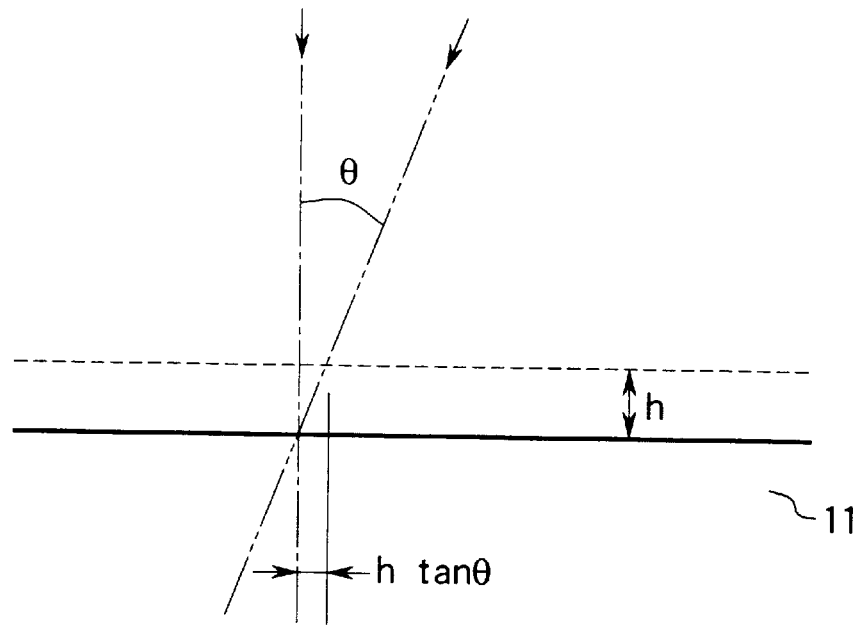
FIG. 21 is a view for explaining a beam incident on a region of a substrate to be exposed in the charged particle beam exposure apparatus of the fourth embodiment.

Since, however, the optical system of this embodiment has a very large field size, a beam enters the peripheral portion of the transfer region of the substrate to be exposed at an angle of several degrees. Therefore, if the surface height is shifted h from a desired position as shown in FIG. 21, the transfer position is shifted $h\tan\theta$ when the incident angle is $\theta$.

Accordingly, assuming that combined exposure with a pattern formed by another exposure apparatus is performed, the positional deviation is 35 nm if h is 1 $\mu$m and $\theta$ is 2°. This indicates that if a roughness of a few $\mu$m exists on the surface of the substrate to be exposed, the positioning accuracy deteriorates.

Since, however, the surface roughness of the substrate to be exposed shows a relatively moderate change, the surface roughness can be decreased to 0.2 $\mu$m or less within the range of about each exposure region, although the value is a few $\mu$m on the entire substrate surface.

The positioning accuracy, therefore, can be improved by adjusting the inclination and height of the substrate to be exposed by the substrate stage so that each exposure region is perpendicular to the optical axis and positioned at a predetermined height.

Methods of combining the mechanism for correcting the inclination of a substrate and the x-y two-dimensional stage are roughly classified into two methods. One is a method of mounting the inclination (height) correcting mechanism on the x-y two-dimensional stage. This method is mechanically simple because a relatively small inclination (height) correcting mechanism is mounted on the relatively large two-dimensional stage.

If, however, the x-y two-dimensional stage is scanned while being kept inclined, the height of the substrate surface changes in accordance with the x-y position. Therefore, transfer must be performed while the substrate surface height is finely adjusted or the focal position and magnification of the optical system are finely adjusted during stage scanning.

The other is a method of mounting the x-y two-dimensional stage on the inclination (height) correcting stage. This method is mechanically slightly complicated because a comparatively large two-dimensional stage is entirely mounted on the comparatively small inclination (height) correcting mechanism. However, the method has the advantage that the height of the substrate surface does not change even if the x-y two-dimensional stage is scanned while being kept inclined.

To fully utilize this advantage, it is preferable to perform adjustment such that the center of inclination correction matches the center of the elongated band-like transfer region described above, so as to eliminate interference between the inclination and the height.

In this embodiment, the former stage is used as the substrate stage, and the latter stage is used as the mask stage. However, stages of any arbitrary methods can be used as the both stages.

Several methods can be used as a practical exposure procedure.

Figure 27:
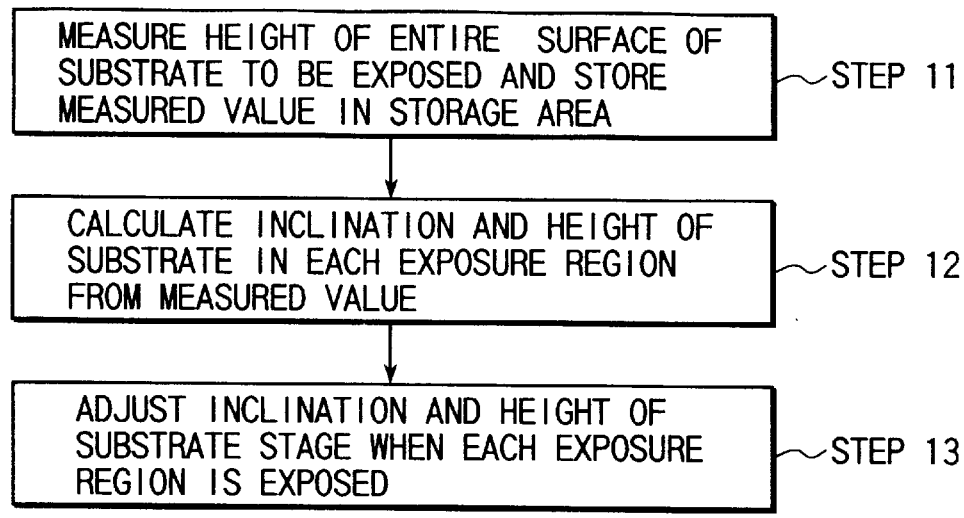
FIG. 27 is a flow chart for explaining an exposure method in the charged particle beam exposure apparatus of the fourth embodiment.

For example, as shown in FIG. 27, after a substrate to be exposed is placed on the substrate stage and before exposure is performed, preferably, at the same time an alignment mark is detected, the height of the entire surface of the substrate is measured and stored in a storage area (Step 11). From this measured value, the inclination and height of the substrate in each exposure region are calculated (Step 12). When the exposure region is exposed, the inclination and height of the substrate stage are adjusted (Step 13).

Figure 28:
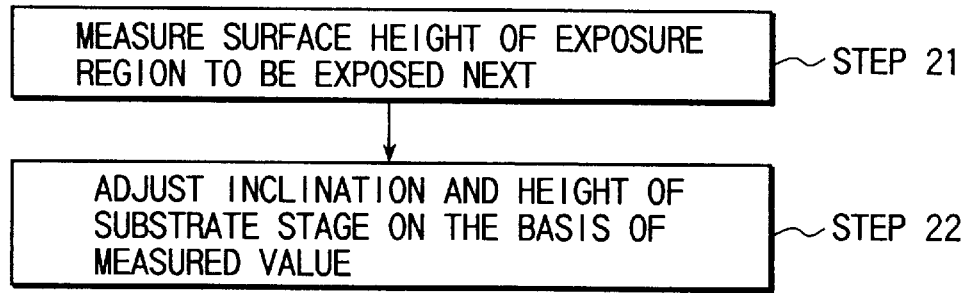
FIG. 28 is a flow chart for explaining an exposure method in the charged particle beam exposure apparatus of the fourth embodiment.

Also, as shown in FIG. 28, before each exposure region is exposed, the surface height of a region to be exposed next is measured (Step 21). From this measured value, the inclination and height of the substrate stage are adjusted (Step 22) to expose the next exposure region.

Figure 29:
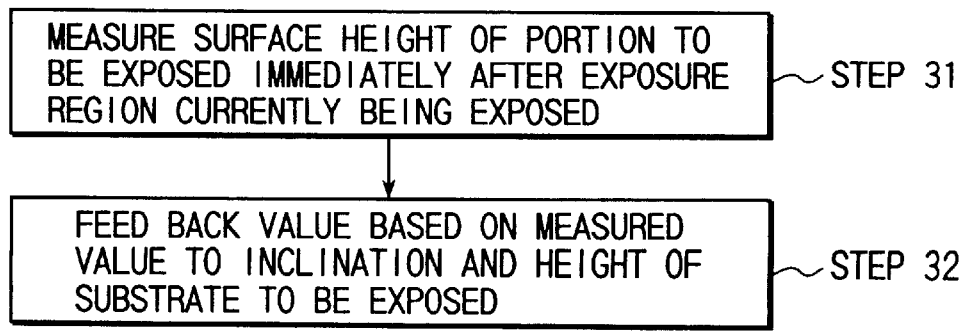
FIG. 29 is a flow chart for explaining an exposure method in the charged particle beam exposure apparatus of the fourth embodiment.

Furthermore, as shown in FIG. 29, the surface height of a portion to be exposed immediately after the exposure region currently being exposed is measured (Step 31) and fed back to the inclination and height of the substrate stage in real time (Step 32), thereby performing exposure.

The third characteristic feature of the improvement of this embodiment is to comprise the mask substrate holding mechanism 58 which includes a piezoelectric element and an electrostatic chuck capable of applying predetermined distortion to a mask substrate, and a control system 20 for controlling the distortion applied by this mask substrate holding mechanism.

This embodiment also comprises a mechanism for calculating distortion to be applied to a mask substrate to obtain desired positioning accuracy and performing exposure by applying distortion to the mask substrate on the basis of the calculated distortion amount.

As described above, the transfer size and transfer shape can be corrected by the use of the various mechanisms. However, although the above-mentioned mechanisms can readily correct so-called first-order distortion in transfer size or transfer shape, it is not easy for them to correct distortion of second or higher order with some exceptions.

Generally, the size of distortion of second or higher order is smaller than that of first-order distortion. However, when first-order distortion is corrected, distortion of second or higher order remains as a residual component. Therefore, this distortion of second or higher order is not negligible to achieve high-accuracy positioning. This higher-order distortion can be readily corrected by changing the shape of the mask by using this mechanism.

Figure 22:
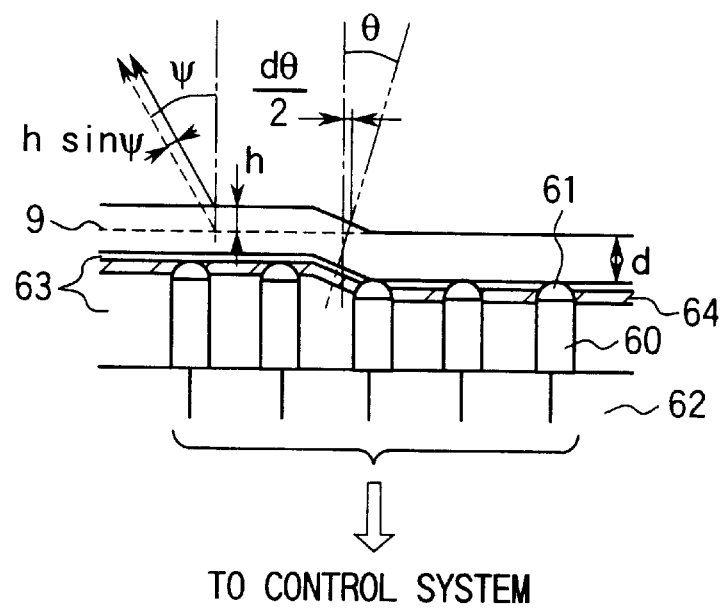
FIG. 22 is a view showing a mask substrate holding mechanism of the charged particle beam exposure apparatus of the fourth embodiment.

More specifically, as shown in FIG. 22, components each constituted by a piezoelectric element 60 and a hard synthetic resin 61 are arranged at intervals of 5 mm on a pedestal 62. A soft insulating synthetic resin 63 and an electrostatic chucking electrode plate 64 are arranged between these components.

When a beam vertically output from the mask 9 is used in image formation, the pattern surface of the mask 9 has a lateral positional distortion of $d\theta/2$ where $\theta$ is the local inclination of the mask 9 and d is the thickness of the mask 9. Therefore, when the mask substrate thickness is 2 mm and a certain piezoelectric element is higher by 1 $\mu$m than an adjacent element, for example, the pattern in this portion can locally have a positional distortion of 0.2 $\mu$m.

Accordingly, if the reduction ratio of the projecting system is ¼, correction of a positional distortion of 50 nm is locally possible on the substrate to be exposed. This mechanism is particularly effective when a reflecting mask is used.

That is, when a transmitting mask is used it is necessary to arrange piezoelectric elements in the peripheral portion of the pattern and indirectly correct positional distortion of the pattern. When a reflecting mask is used, however, piezoelectric elements can be arranged immediately below the pattern. This makes various positional distortion corrections feasible.

On the other hand, when a beam not vertically output from a mask is used in image formation, the mask has a positional distortion of $h\sin\phi$, where $\phi$ is the angle of the exit beam in a direction perpendicular to the mask and h is the difference between the height of the mask surface and its original height, in addition to the distortion described above. Therefore, when $\phi$ is 30° and h is 1 $\mu$m, for example, the pattern in this portion can have a positional distortion of 0.5 $\mu$m. Accordingly, if the reduction ratio of the projecting system is ¼, correction of a positional distortion of 125 nm is locally possible on a substrate to be exposed.

Figure 30:
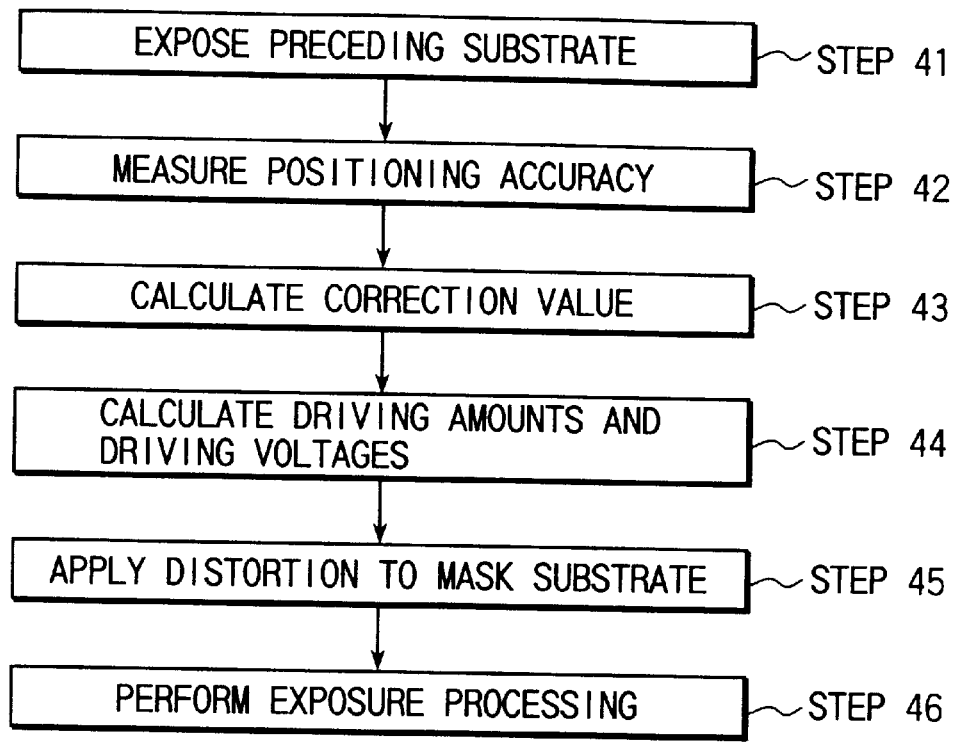
FIG. 30 is a flow chart for explaining an exposure method in the charged particle beam exposure apparatus of the fourth embodiment.

As shown in FIG. 30, a practical exposure procedure is to first expose a preceding substrate while the correction value of the distortion correcting mechanism is set to 0 (Step 41) and measure positioning accuracy (Step 42).

Next, on the basis of the measured value of the positioning accuracy, a desired correction value is calculated (Step 43). On the basis of this calculated value, the control system calculates the driving amounts to be applied to the individual piezoelectric elements and driving voltages required to apply the driving amounts (Step 44). After distortion is actually applied to the mask substrate (Step 45), exposure processing is performed (Step 46).

Figure 31:
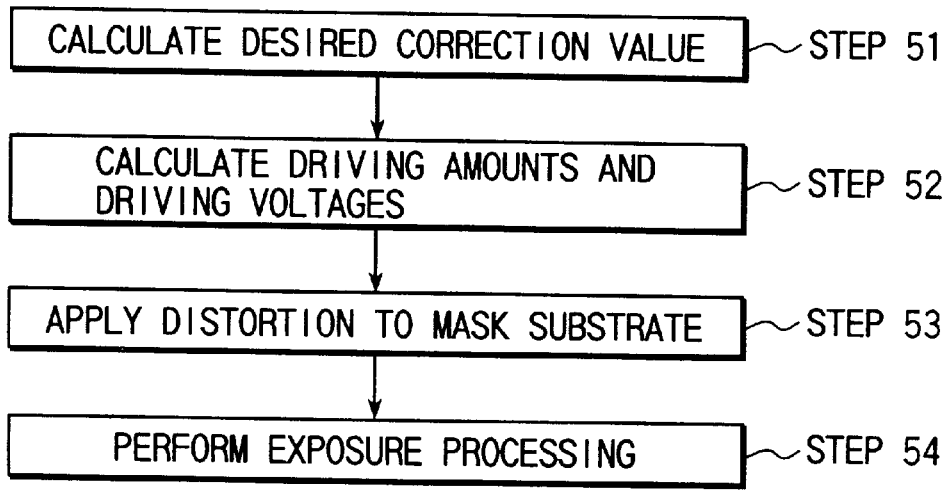
FIG. 31 is a flow chart for explaining an exposure method in the charged particle beam exposure apparatus of the fourth embodiment.

FIG. 31 shows an exposure procedure when the pattern positional distortion of the under layer substrate is already known such as when the characteristics of an exposure apparatus in which an under layer pattern is formed are well known, or when known positional distortion exists in the mask pattern. As shown in FIG. 31, a desired correction value is calculated on the basis of these predicted positional distortions (Step 51). On the basis of this calculated value, the control system calculates the driving amounts to be applied to the individual piezoelectric elements and the driving voltages required to apply the driving amounts (Step 52). After distortion is actually applied to the mask substrate (Step 53), exposure processing is performed (Step 54). Alternatively, it is possible to perform this exposure for a preceding substrate and again execute Steps 41 to 46.

In this embodiment, distortion is applied by using piezoelectric elements. However, distortion can also be applied by using thermal expansion by local heating using separate heaters or the like.

As described above, positional distortion also occurs due to the generation of heat. This indicates that it is effective to install the constant mask temperature setting mechanism 59 in order to prevent the temperature of the mask or the mask stage from changing due to the absorption of a beam incident on the mask or heat generated by various mechanisms and thereby avoid unwanted positional distortion.

The constant mask temperature setting mechanism can be miniaturized when formed by using a Peltier element.

However, it is also possible to circulate a heat medium, such as water, connected to a constant temperature setting apparatus which performs normal heating and cooling. Furthermore, this arrangement can naturally be applied to correction of not only distortion of second or higher order but also first-order distortion.

The fourth characteristic feature of the improvement of this embodiment is that the illuminating optical system has a function of irradiating a beam having a linear sectional shape onto a mask and a function of deflecting the entire beam in the direction of the linear section of the beam, and, letting l and w be the length and width of a beam projected onto a mask by the illuminating optical system, respectively, W be the width of a transfer region on the mask, and v be the moving velocity of the mask stage during transfer, the illuminating optical system has a function of performing exposure while scanning the entire beam in the direction of the linear section of the beam under conditions of a width of W+l or more and a period of w/nv (n: positive integer).

It is originally possible to use various methods as the illuminating system of the present invention. Examples are a method which illuminates an elongated band-like region by performing deflection at a high speed by using a beam source having a point-like sectional shape, a method which uses a beam source having a linear sectional shape by enlarging it, and a method which forms an elongated band-like region by using a beam source having a two-dimensionally extended sectional shape by cutting a portion of the beam source by a selector aperture.

Since, however, the optical system of the present invention has a linear field, the use of a linear beam source is desirable. If a linear beam source having intensity unevenness is directly enlarged, however, this intensity distribution is also directly enlarged. This can cause exposure amount unevenness.

Figure 23:
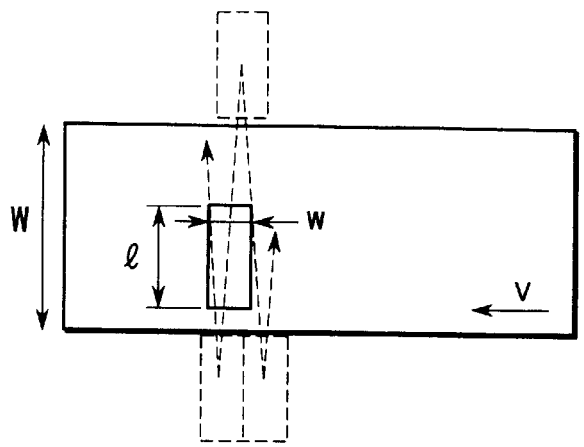
FIG. 23 is a view for explaining a charged particle beam exposure method in the charged particle beam exposure apparatus of the fourth embodiment.

In this embodiment, therefore, the influence of the intensity distribution is averaged by scanning a beam in its line direction. This makes it possible to improve the apparent uniformity. More specifically, as shown in FIG. 23, to obtain sufficient uniformity of the intensity by beam scan, the amplitude of the scan is set to be larger than the sum of the beam length l and the width W of the transfer region on the mask. Also, to avoid the formation of a gap or unnecessary overlap in the irradiated region, the period of the scan is set to 1/n (n: positive integer) the time obtained by dividing the width w of the beam by the moving velocity v of the mask stage.

That is, transfer is so performed that scan of a period n is performed while the mask stage moves by w. Consequently, it becomes possible to largely suppress the exposure intensity unevenness.

When the influence of the intensity unevenness of a beam source is decreased by the above method, as is also apparent from FIG. 23, a beam not contributing to exposure exists on the two ends. To improve the efficiency of the apparatus, therefore, it is more desirable to make the intensity uniform by some other method.

In a more improved embodiment of the present invention, therefore, a beam source has a wedge-shaped charged particle emission electrode and an electrode having a shape which surrounds the tip of the charged particle emission electrode. The electrode having the shape surrounding the charged particle emission electrode is connected to a terminal at a predetermined potential via a distribution resistor.

Figure 24:
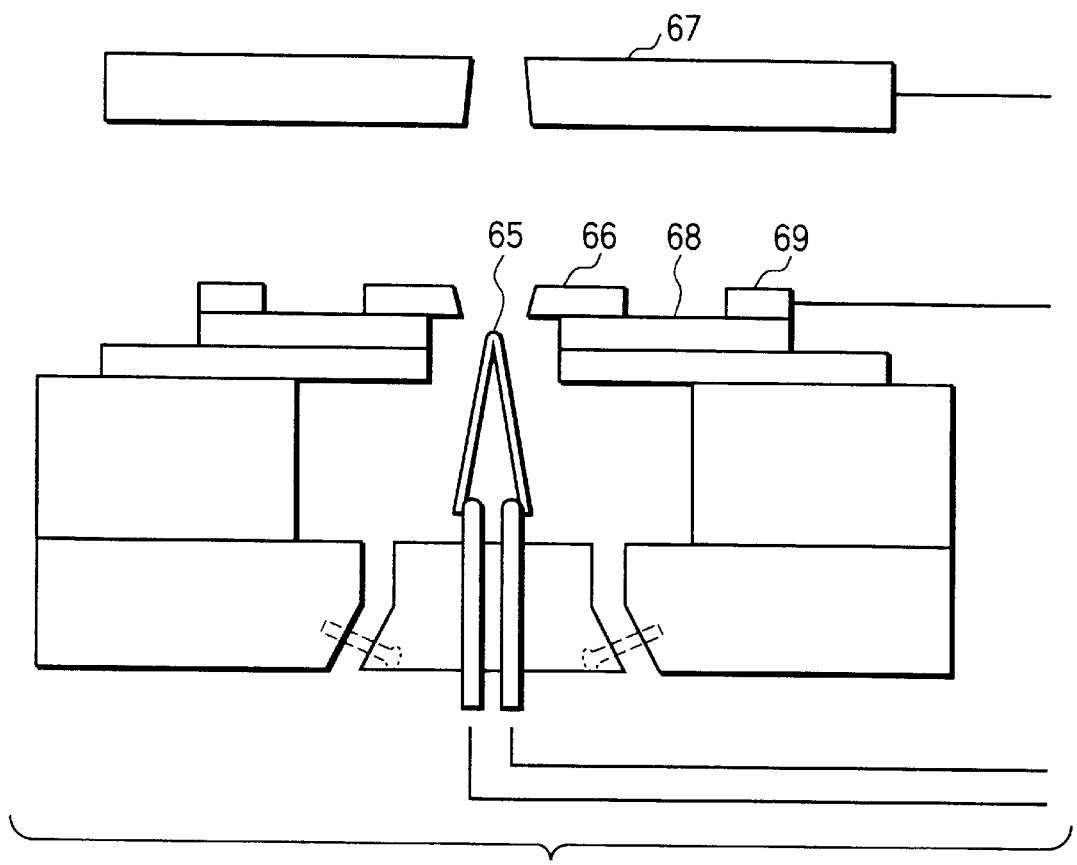
FIG. 24 is a view for explaining a beam source of the charged particle beam exposure apparatus of the fourth embodiment.
Figure 25:
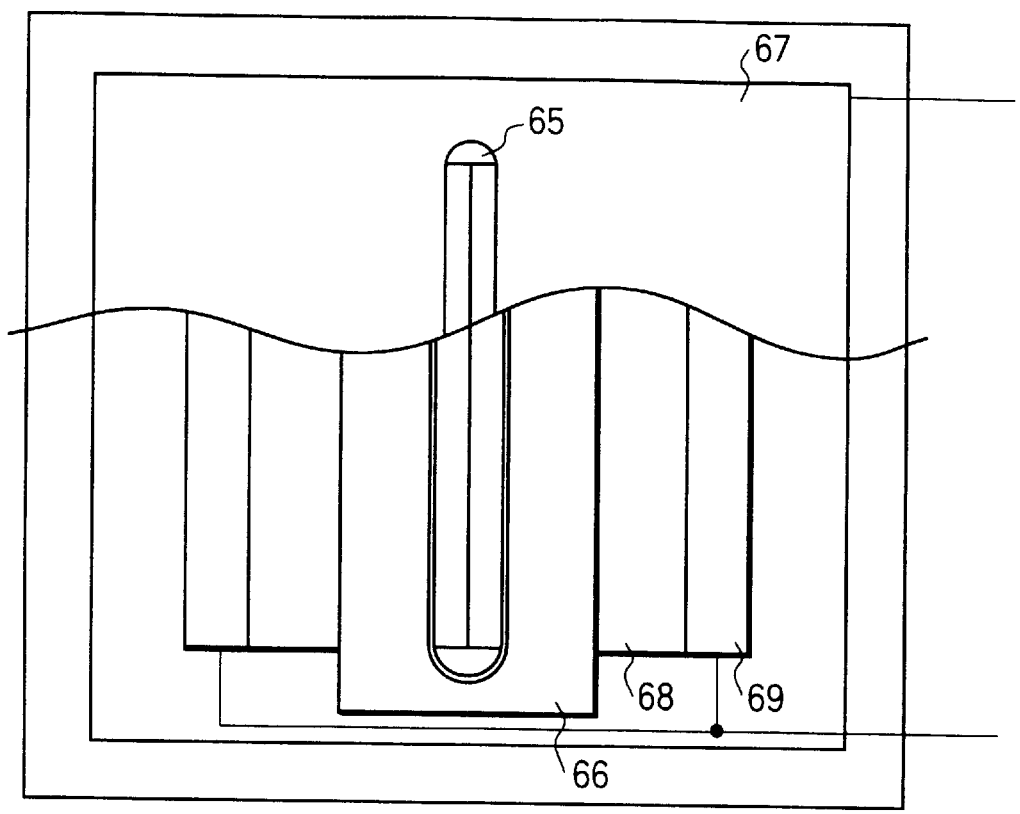
FIG. 25 is a view for explaining the beam source of the charged particle beam exposure apparatus of the fourth embodiment.

More specifically, as shown in FIGS. 24 and 25, an electrode 66 is so formed as to surround the tip of an electron emission electrode 65 made from a thin tungsten plate. An extraction electrode 67 is arranged above the electrode 66.

Figure 26:
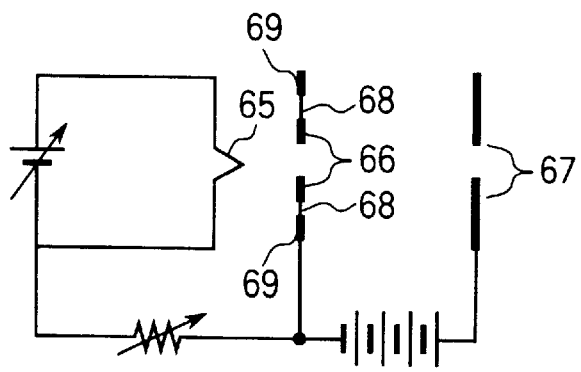
FIG. 26 is a circuit diagram of the beam source of the charged particle beam exposure apparatus of the fourth embodiment.

As shown in FIG. 26, the electrode 66 is connected to another electrode 69 via a high-resistance layer 68 as a distribution resistor. When an electric current is applied, the electron emission electrode 65 is heated to a high temperature and emits thermoelectrons.

The emitted thermoelectrons are attracted to and accelerated by the extraction electrode 67. Some of the thermoelectrons are absorbed by the electrode 66, pass through the high-resistance layer 68, and are finally supplied to a portion at the same potential as the electron emission electrode 65. At this time, the electrode 66 generates a voltage equivalent to the product of the total resistance of the electron paths and the current value.

Consequently, the electrode 66 is negatively charged to suppress the inflow of electrons. However, the current reduces when the inflow of electrons reduces, and as a consequence the voltage generated by the electrode 66 also reduces. This encourages the inflow of electrons.

By this mechanism, the amount of electrons emitted from the electron emission electrode 65, the inflow amount of electrons to the electrode 66, and the potential of the electrode 66 are set in an equilibrium state. At the same time, if a distribution takes place in the amount of electrons flowing into the electrode 66, i.e., in the amount of electrons emitted from the electron emission electrode 65, a mechanism which suppresses this distribution automatically functions because the electrode 66 is connected to another electrode via the high-resistance layer 68 as a distribution resistor.

That is, when electrons emitted from a certain portion of the electron emission electrode 65 increase, the potential of the electrode 66 in the vicinity of that portion rises. Consequently, the increase in the emission electrons is suppressed.

With this structure, therefore, the uniformity of a linear beam source can be automatically improved. Note that the present invention is not limited to this embodiment. That is, field emission electrons or photoelectrons can be used as an electron emission source. Also, the arrangement and the potentials of other electrodes can be selected from a wide range of variations, e.g., a plurality of stages of extraction electrodes can be formed.

Various forms are applicable when exposure is actually performed by the exposure system formed by using this embodiment.

For example, to perform alignment it is possible to apply a method by which the mark position on the substrate is detected and stored by previously scanning the substrate stage, and the substrate and the mask are aligned on the basis of the stored mark position when exposure is actually performed. It is also possible to apply a method by which the mark position and focal point in the region to be exposed immediately after the preceding region are constantly detected during exposure and exposure is performed by applying feedback, or a method by which the mark position on the substrate is detected for each chip and exposure is performed by performing alignment for each chip.

In the previous embodiments, a lens is formed by using only an electric field. However, the present invention can also be practiced by using a magnetic field.

Note that the present invention is not limited to the embodiments described above. In each embodiment, an electron beam is used as a charged particle beam. However, the present invention is similarly applicable to a case in which an ion beam is used.

Furthermore, the application of the present invention is not limited to a transfer apparatus. For example, the present invention can be applied to various analyzers using a charged particle beam. Moreover, various modifications of the present invention can be practiced without departing from the gist of the invention.

$$\phi = \frac{k}{2}r^2 - \alpha \ln r - kz^2 \tag{1}$$

$$m(\ddot{r} - r\dot{\theta}^2) = -q\left(kr - \frac{\alpha}{r}\right) \tag{2}$$

$$m \frac{1}{r} \frac{d}{dt}(r^2 \dot{\theta}) = 0 \tag{3}$$

$$m\ddot{z} = 2\,qkz \tag{4}$$

$$m\left(\ddot{r} - \frac{C^2}{r^3}\right) = -q\left(kr - \frac{\alpha}{r}\right) \tag{5}$$

$$-qkr_0^4 + q\alpha r_0^2 + mC^2 = 0 \tag{6}$$

$$m\ddot{\rho} = -qk(r_0 + \rho) + \frac{q\alpha}{r_0 + \rho} + q\frac{kr_0^4 - \alpha r_0^2}{(r_0 + \rho)^3} \tag{7}$$

$$m\ddot{\rho} = -q\left(4k - 2\frac{\alpha}{r_0^2}\right)\rho \tag{8}$$

$$\frac{k}{2}r_{in}^2 - \alpha \ln r_{in} - kz_{in}^2 = V_{in} \tag{9}$$

$$\frac{k}{2}r_{out}^2 - \alpha \ln r_{out} - kz_{out}^2 = V_{out} \tag{10}$$

$$r = r_0 + (r_i + r_0)\cos\left(\sqrt{\frac{e}{m_0}\left(\frac{2\alpha}{r_0^2} - 4k\right)}\,t\right) \tag{11}$$

$$z = z_i \cos\left(\sqrt{\frac{2ek}{m_0}}\,t\right) \tag{12}$$

$$r_0 = \sqrt{\frac{e\alpha - 2E}{ek}} \tag{13}$$

$$r^2 \dot{\theta} = r_i \sqrt{\frac{2E}{m_0}} \tag{14}$$

$$\theta = \int_0^t \frac{r_i}{r(t)^2} \sqrt{\frac{2E}{m_0}}\,d\tau \tag{15}$$

$$\theta = \frac{1}{r_0}\sqrt{\frac{2E}{m_0}}\,t \tag{16}$$

$$r = r_0 + (r_i - r_0)\cos\left(\sqrt{\frac{e}{E}\left(\frac{\alpha}{r_0^2} - 2k\right)}\,r_0\theta\right) \tag{17}$$

$$z = z_i \cos\left(\sqrt{\frac{ek}{E}}\,r_0\theta\right) \tag{18}$$

$$r = r_0 + (r_i - r_0)\cos\left(\sqrt{\frac{e}{E}\left(\frac{\alpha}{r_0^2} - 2k\right)}\,r_0\theta_e\right) - \tag{19}$$
$$\xi \sqrt{\frac{e}{E}\left(\frac{\alpha}{r_0^2} - 2k\right)}\,(r_i - r_0)\sin\left(\sqrt{\frac{e}{E}\left(\frac{\alpha}{r_0^2} - 2k\right)}\,r_0\theta_e\right)$$

$$z = z_i \cos\left(\sqrt{\frac{ek}{E}}\,r_0\theta_e\right) - \xi \sqrt{\frac{ek}{E}}\,z_i \sin\left(\sqrt{\frac{ek}{E}}\,r_0\theta_e\right) \tag{20}$$

-continued $$\xi_{fr} = \frac{1}{\sqrt{\frac{e}{E}\left(\frac{\alpha}{r_0^2} - 2k\right)}\,\tan\left(\sqrt{\frac{e}{E}\left(\frac{\alpha}{r_0^2} - 2k\right)}\,r_0\theta_e\right)} \tag{21}$$

$$\xi_{fz} = \frac{1}{\sqrt{\frac{ek}{E}}\,\tan\left(\sqrt{\frac{ek}{E}}\,r_0\theta_e\right)} \tag{22}$$

$$\xi_{fr} = \frac{1}{\sqrt{\frac{ek}{E}\left(\frac{4 - \frac{e\alpha}{E}}{\frac{e\alpha}{E} - 2}\right)}\,\tan\left(\sqrt{4 - \frac{e\alpha}{E}}\,\theta_e\right)} \tag{23}$$

$$\xi_{fz} = \frac{1}{\sqrt{\frac{ek}{E}}\,\tan\left(\sqrt{\frac{e\alpha}{E} - 2}\,\theta_e\right)} \tag{24}$$

$$A_\theta = -\frac{2k}{3}r^2 + \alpha r + kz^2 \tag{25}$$

$$m_0(\ddot{r} - r\dot{\theta}^2) = 2e\sqrt{\frac{2E}{m_0}}\,(kr - \alpha) \tag{26}$$

$$m_0 \frac{1}{r} \frac{d}{dt}(r^2 \dot{\theta}) = 0 \tag{27}$$

$$m_0 \ddot{z} = -2e\sqrt{\frac{2E}{m_0}}\,kz \tag{28}$$

$$m_0 \ddot{\rho} = 2e\sqrt{\frac{2E}{m_0}}\,\left(4k - \frac{3\alpha}{r_0}\right)\rho \tag{29}$$

$$e\sqrt{\frac{2E}{m_0}}\,(kr_0^2 - \alpha r_0) + E = 0 \tag{30}$$

$$\xi_{fr} = \frac{1}{\sqrt{e\left(\frac{3\alpha}{r_0} - 4k\right)\sqrt{\frac{2}{m_0 E}}}\,\tan\left(\sqrt{e\frac{3\alpha}{r_0} - 4k}\sqrt{\frac{2}{m_0 E}}\,r_0\theta_e\right)} \tag{31}$$

$$\xi_{fz} = \frac{1}{\sqrt{\frac{ek}{E}\sqrt{\frac{2E}{m_0}}}\,\tan\left(\sqrt{\frac{ek}{E}}\sqrt{\frac{2E}{m_0}}\,r_0\theta_e\right)} \tag{32}$$

$$r_0 = \frac{\alpha \pm \sqrt{\alpha^2 - \frac{4k}{e}\sqrt{\frac{m_0 E}{2}}}}{2k} \tag{33}$$

$$\phi_m = -2\,krz + 2\,\alpha z = -2\,kz\left(r - \frac{\alpha}{k}\right) \tag{34}$$

$$-2\,kr_1 z_1 + 2\,\alpha\,z_1 = C_1 \tag{35}$$

$$-2\,kr_2 z_2 + 2\,\alpha\,z_2 = C_2 \tag{36}$$

$$-2\,kr_3 z_3 + 2\,\alpha\,z_3 = C_3 \tag{37}$$

$$-2\,kr_4 z_4 + 2\,\alpha\,z_4 = C_4 \tag{38}$$

$$m\ddot{\rho} = -q\left(4k - 2\frac{\alpha}{r_0^2}\right)\rho + \left(\frac{5\alpha}{r_0} - 6\,kr_0\right)\frac{\rho^2}{r_0^2} \tag{39}$$

$$m_0 \ddot{\rho} = 2\,ek\frac{e\alpha - 4E}{e\alpha - 2E}\rho + \left(12\frac{E}{e} - \alpha\right)\left(\frac{ek}{e\alpha - 2E}\right)^{\frac{3}{2}}\rho^2 \tag{40}$$

$$m_0\ddot{\rho} = 2e\sqrt{\frac{2E}{m_0}}\left(4k - \frac{3\alpha}{r_0}\right)\rho - 12e\sqrt{\frac{2E}{m_0}}(kr_0 - \alpha)\frac{\rho^2}{r_0^2} \qquad (41)$$

In the present invention as has been described in detail above, an electric field or a magnetic field in a cylindrical coordinate system is so set as to be defined by the above equations, thereby preventing aberrations from extremely increasing even when the field size is increased. Consequently, it is possible to realize a charged particle beam optical element capable of high-accuracy, high-speed pattern formation and a charged particle beam optical system and a charged particle beam exposure apparatus using this optical element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A charged particle beam optical element comprising:
   electrodes configured to form a partially rotationally symmetrical electromagnetic field in at least a portion of a space and configured to make a sectional shape of a charged particle beam passing through the electromagnetic field larger in a binormal direction to a trajectory of the beam than in a principal normal direction to the trajectory.

2. An element according to claim 1, wherein a straight line formed in a position where a trajectory of a central axis of the charged particle beam intersects a normal plane matches an axis of rotational symmetry of the electromagnetic field.

3. An element according to claim 2, wherein the axis of rotational symmetry exists outside a region where the charged particle beam passes.

4. An element according to claim 1, wherein a focal length in the principal normal direction to the trajectory of the central axis of the charged particle beam is equal to a focal length in the binormal direction to the trajectory.

5. An element according to claim 2, wherein a focal length in the principal normal direction to the trajectory of the central axis of the charged particle beam is equal to a focal length in the binormal direction to the trajectory.

6. An element according to claim 1, wherein a focal length in the principal normal direction to the trajectory of the central axis of the charged particle beam is different from a focal length in the binormal direction to the trajectory.

7. An element according to claim 2, wherein a focal length in the principal normal direction to the trajectory of the central axis of the charged particle beam is different from a focal length in the binormal direction to the trajectory.

8. A charged particle beam optical element comprising two electrodes arranged to oppose each other at a distance and configured to converge a charged particle beam,
   wherein when a voltage is applied to the two electrodes, the charged particle beam optical element spatially partially forms an electric field having an effective part, except for an arbitrary constant of a field potential, given by $$\phi = (k/2)r^2 - \alpha \ln r - kz^2$$

(k, α: arbitrary constants)
in a cylindrical coordinate system defined by (r, z, θ).

9. A charged particle beam optical element comprising:
   two electrodes arranged to oppose each other at a distance and configured to converge a charged particle beam,
   wherein opposing surfaces of said electrodes are cylindrically symmetrical and represented by $$(k/2)r^2 - \alpha \ln r - kz^2 = C.$$

10. An element according to claim 8, wherein said electrodes are configured to converge an electron beam, and E and e being energy and elementary charge of the electron beam, respectively, a condition given by $$2<e\ \alpha/E<4$$

is satisfied.

11. An element according to claim 9, wherein an electron beam is used as the charged particle beam, and letting E and e be energy and elementary charge of the electron beam, respectively, a condition given by $$2<e\ \alpha/E<4$$

is satisfied.

12. An element according to claim 9, wherein a radius $r_0$ of a trajectory of a central axis of the charged particle beam is smaller than an average value of radii $r_{in}$ and $r_{out}$ of said two electrodes when z=0.

13. A charged particle beam optical element comprising magnetic circuits arranged to oppose each other and configured to converge a charged particle beam,
   wherein when a current is applied to the magnetic circuits, the charged particle beam optical element spatially partially forms a magnetic field, through which a charged particle beam passes, having an effective part, except for an arbitrary function (a function which satisfies rot F=0) of a magnetic vector potential, given by $$A_r = 0$$

$$A_\theta = -(2k/3)r^2 + \alpha r + kz^2$$

in a cylindrical coordinate system defined by (r, z, θ) where k and d are arbitrary constants.

14. A charged particle beam optical element which comprises at least three magnetic poles arranged to oppose each other at a distance and functions as a charged particle lens for converging a charged particle beam by passing the beam between said magnetic poles,
   wherein opposing surfaces of at least two of said three magnetic poles are cylindrically symmetrical and represented by $$-2\ krz + 2\ \alpha z = C.$$

15. An element according to claim 13, wherein said magnetic circuits are configured to converge an electron beam, and E, e, and $m_0$ being energy, elementary charge, and rest mass of the electron beam, respectively, conditions given by $$\alpha > 0 \text{ and } \alpha 2 \geq (4k/e) \cdot \{m_0 E/2\}^{(1/2)}$$

are satisfied.

16. An element according to claim 14, wherein an electron beam is used as the charged particle beam, and letting E, e, and $m_0$ be energy, elementary charge, and rest mass of the electron beam, respectively, conditions given by $$\alpha>0 \text{ and } \alpha^2 \geq (4k/e) \cdot \{m_0 E/2\}^{(1/2)}$$

are satisfied.

17. An element according to claim 13, wherein a radius $r_0$ of a trajectory of a central axis of the charged particle beam satisfies a condition given by $$r_0 < 3 \alpha/(4k).$$

18. An element according to claim 14, wherein a radius $r_0$ of a trajectory of a central axis of the charged particle beam satisfies a condition given by $$r_0 < 3 \alpha/(4k).$$

19. An element according to claim 15, wherein a radius $r_0$ of a trajectory of a central axis of the charged particle beam satisfies a condition given by $$r_0 < 3 \alpha/(4k).$$

20. An element according to claim 16, wherein a radius $r_0$ of a trajectory of a central axis of the charged particle beam satisfies a condition given by $$r_0 < 3 \alpha/(4k).$$

21. A charged particle beam optical system comprising an illuminating optical system configured to irradiate a charged particle beam emitted from a beam source onto a mask and a projecting optical system configured to project the charged particle beam onto a substrate to be exposed, wherein said illuminating optical system comprises a first charged particle beam optical element configured to form a partially rotationally symmetrical electromagnetic field in at least a portion of a space and configured to make a sectional shape of a charged particle beam passing through the electromagnetic field larger in a binormal direction to a trajectory of the beam than in a principal normal direction to the trajectory, and said projecting optical system comprises a second charged particle beam optical element configured to form a partially rotationally symmetrical electromagnetic field in at least a portion of a space and configured to make a sectional shape of a charged particle beam irradiated from said illuminating optical system and passing through the electromagnetic field larger in a binormal direction to a trajectory of the beam than in a principal normal direction to the trajectory.

22. A charged particle beam optical system comprising an illuminating optical system configured to irradiate a charged particle beam emitted from a beam source onto a mask and a projecting optical system configured to project the charged particle beam onto a substrate to be exposed, wherein said illuminating optical system comprises a first charged particle beam optical element configured to spatially partially form an electric field having an effective part, except for an arbitrary constant of a field potential, given by $$\phi=(k/2)r^2-\alpha \ln r - kz^2$$

(k, α: arbitrary constants)

in a cylindrical coordinate system defined by (r, z, θ), and said projecting optical system comprises a second charged particle beam optical element configured to spatially partially form an electric field having an effective part, except for an arbitrary constant of a field potential, given by $$\phi=(k'/2)r^2-\alpha' \ln r - k'z^2$$

(k', α': arbitrary constants)

in a cylindrical coordinate system defined by (r, z, θ).

23. A charged particle beam optical system comprising an illuminating optical system configured to irradiate a charged particle beam emitted from a beam source onto a mask and a projecting optical system configured to project the charged particle beam onto a substrate to be exposed, wherein said illuminating optical system comprises a first charged particle beam optical element configured to spatially partially form a magnetic field whose effective part, except for an arbitrary function (a function which satisfies rot F=0) of a magnetic vector potential, is given by $$Ar = 0$$
$$A_\theta = -(2k/3)r^2 + \alpha \, r + kz^2$$
$$Az = 0$$

(k, α: arbitrary constants)

in a cylindrical coordinate system defined by (r, z, θ), and said projecting optical system comprises a second charged particle beam optical element configured to spatially partially form a magnetic field whose effective part, except for an arbitrary function (a function which satisfies rot F=0) of a magnetic vector potential, is given by $$Ar=0$$
$$A_\theta=-(2k'/3)r^2+\alpha' r+k'z^2$$
$$Az=0$$

(k', α': arbitrary constants)

in a cylindrical coordinate system defined by (r, z, θ).

24. A system according to claim 21, wherein said illuminating optical system comprises:

a quadrupole lens for correcting defocusing in r- and z-axis directions of a charged particle beam emitted from said beam source; and an alignment lens for adjusting an optical axis of the charged particle beam emitted from said beam source.

25. A system according to claim 22, wherein said illuminating optical system comprises:

a quadrupole lens for correcting defocusing in r- and z-axis directions of the charged particle beam emitted from said beam source; and an alignment lens for adjusting an optical axis of the charged particle beam emitted from said beam source.

26. A system according to claim 23, wherein said illuminating optical system comprises:

a quadrupole lens for correcting defocusing in r- and z-axis directions of the charged particle beam emitted from said beam source; and an alignment lens for adjusting an optical axis of the charged particle beam emitted from said beam source.

27. A system according to claim 21, wherein said projecting optical system comprises:
a quadrupole lens for correcting defocusing in r- and z-axis directions of the charged particle beam emitted from said illuminating optical system;
an alignment lens for adjusting an optical axis of the charged particle beam emitted from said illuminating optical system; and
adjusting means for adjusting a relative rotational relationship between said second charged particle beam optical element and said quadrupole lens with respect to the optical axis.

28. A system according to claim 22, wherein said projecting optical system comprises:
a quadrupole lens for correcting defocusing in r- and z-axis directions of the charged particle beam emitted from said illuminating optical system;
an alignment lens for adjusting an optical axis of the charged particle beam emitted from said illuminating optical system; and
adjusting means for adjusting a relative rotational relationship between said second charged particle beam optical element and said quadrupole lens with respect to the optical axis.

29. A system according to claim 23, wherein said projecting optical system comprises:
a quadrupole lens for correcting defocusing in r- and z-axis directions of the charged particle beam emitted from said illuminating optical system;
an alignment lens for adjusting an optical axis of the charged particle beam emitted from said illuminating optical system; and
adjusting means for adjusting a relative rotational relationship between said second charged particle beam optical element and said quadrupole lens with respect to the optical axis.

30. A charged particle beam exposure apparatus comprising:
an illuminating optical system configured to irradiate a charged particle beam emitted from a beam source onto a mask; and
a projecting optical system configured to project the charged particle beam onto a substrate to be exposed,
wherein said illuminating optical system comprises a first charged particle beam optical element configured to form a partially rotationally symmetrical electromagnetic field in at least a portion of a space and configured to make a sectional shape of a charged particle beam passing through the electromagnetic field larger in a binormal direction to a trajectory of the beam than in a principal normal direction to the trajectory, and
said projecting optical system comprises a second charged particle beam optical element configured to form a partially rotationally symmetrical electromagnetic field in at least a portion of a space and configured to form a sectional shape of a charged particle beam irradiated from said illuminating optical system and passing through the electromagnetic field larger in a binormal direction to a trajectory of the beam than in a principal normal direction to the trajectory.

31. A system according to claim 21, further comprising an alignment mechanism for adjusting a relative position of said mask and said substrate, and a mechanism for scanning a relative positional relationship between said mask, said substrate, and said projecting optical system while said alignment mechanism is in operation.

32. A system according to claim 22, further comprising an alignment mechanism for adjusting a relative position of said mask and said substrate, and a mechanism for scanning a relative positional relationship between said mask, said substrate, and said projecting optical system while said alignment mechanism is in operation.

33. A system according to claim 23, further comprising an alignment mechanism for adjusting a relative position of said mask and said substrate, and a mechanism for scanning a relative positional relationship between said mask, said substrate, and said projecting optical system while said alignment mechanism is in operation.

34. An apparatus according to claim 30, further comprising an alignment mechanism for adjusting a relative position of said mask and said substrate, and a mechanism for scanning a relative positional relationship between said mask, said substrate, and said projecting optical system while said alignment mechanism is in operation.

35. A charged particle beam exposure apparatus comprising:
an illuminating optical system configured to irradiate a charged particle beam emitted from a first beam source onto a mask;
a projecting optical system configured to project the charged particle beam onto a substrate to be exposed; and
an adjusting optical system configured to irradiate a charged particle beam, emitted from a second beam source to adjust said projecting optical system, onto said projecting optical system,
wherein at least one of said illuminating optical system and said projecting optical system comprises a charged particle beam optical element configured to form a partially rotationally symmetrical electromagnetic field in at least a portion of a space and configured to make a sectional shape of a charged particle beam passing through the electromagnetic field larger in a binormal direction to a trajectory of the beam than in a principal normal direction to the trajectory.

36. An apparatus according to claim 35, wherein
said illuminating optical system further comprises deflecting means for deflecting the charged particle beam emitted from said first beam source, and
said projecting optical system further comprises correcting means for performing correction, on the basis of a deflection amount of the charged particle beam deflected by said deflecting means, so as to match an optical axis of the charged particle beam deflected by said deflecting means with an optical axis of said illuminating optical system.

37. An apparatus according to claim 35, wherein said mask is selected from a plurality of masks, different in reduction ratio to said substrate to be exposed, in accordance with a pattern to be transferred to said substrate.

38. A method of adjusting a charged particle beam exposure apparatus comprising:
an illuminating optical system configured to irradiate a charged particle beam emitted from a first beam source onto a mask;
a projecting optical system configured to project the charged particle beam onto a substrate to be exposed; and
an adjusting optical system configured to irradiate a charged particle beam, emitted from a second beam source to adjust said projecting optical system, onto said projecting optical system, wherein at least one of said illuminating optical system and said projecting optical system comprises a charged particle beam optical element configured to form a partially rotationally symmetrical electromagnetic field in at least a portion of a space and configured to make a sectional shape of a charged particle beam passing through the electromagnetic field larger in a binormal direction to a trajectory of the beam than in a principal normal direction to the trajectory, comprising the steps of:

adjusting said illuminating optical system by using the charged particle beam emitted from said first beam source; and adjusting said projecting optical system by using the charged particle beam irradiated from said adjusting optical system.

39. A method according to claim 38, wherein said illuminating optical system further comprises deflecting means for deflecting the charged particle beam emitted from said first beam source, and said projecting optical system further comprises correcting means for performing correction, on the basis of a deflection amount of the charged particle beam deflected by said deflecting means, so as to match an optical axis of the charged particle beam deflected by said deflecting means with an optical axis of said illuminating optical system, further comprising the step of performing correction, on the basis of the deflection amount of the charged particle beam deflected by said deflecting means, so as to match the optical axis of the charged particle beam deflected by said deflecting means with the optical axis of said illuminating optical system, after the step of adjusting said projecting optical system.

40. A method according to claim 38, wherein said mask is selected from a plurality of masks, different in reduction ratio to said substrate to be exposed, in accordance with a pattern to be transferred to said substrate.

41. A charged particle beam exposure apparatus comprising:

an illuminating optical system for irradiating a charged particle beam emitted from a beam source onto a mask mounted on a first stage;

a projecting optical system for projecting the charged particle beam onto a substrate to be exposed mounted on a second stage;

first measuring means for measuring a position of said first stage;

second measuring means for measuring a position of said second stage;

calculating means for calculating a first deviation amount indicating a deviation of said first stage from a predetermined position on the basis of the position of said first stage measured by said first measuring means and a second deviation amount indicating a deviation of said second stage from a predetermined position on the basis of the position of said second stage measured by said second measuring means; and correcting means for correcting a position, on said substrate, of the charged particle beam irradiated onto said substrate on the basis of the first and second deviation amounts calculated by said calculating means, wherein at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

42. A charged particle beam exposure apparatus comprising:

an illuminating optical system for irradiating a charged particle beam emitted from a beam source onto a mask mounted on a first stage;

a projecting optical system for projecting the charged particle beam onto a substrate to be exposed mounted on a second stage;

first measuring means for measuring a vertical distance to a surface of said substrate;

second measuring means for measuring an inclination of the surface of said substrate to an optical axis of the charged particle beam; and correcting means for correcting the vertical distance to the surface of said substrate to a predetermined distance on the basis of the vertical distance measured by said first measuring means and correcting the surface of said substrate to be perpendicular to the optical axis of the charged particle beam on the basis of the inclination measured by said second measuring means, wherein at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

43. A charged particle beam exposure apparatus comprising:

an illuminating optical system for irradiating a charged particle beam emitted from a beam source onto a mask mounted on a first stage;

a projecting optical system for projecting the charged particle beam onto a substrate to be exposed mounted on a second stage;

calculating means for calculating distortion to be applied to said mask to obtain desired positioning accuracy; and distortion applying means for applying distortion to said mask on the basis of the distortion calculated by said calculating means, wherein at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

44. A charged particle beam exposure apparatus comprising:

an illuminating optical system for irradiating a charged particle beam emitted from a beam source onto a mask mounted on a first stage; and a projecting optical system for projecting the charged particle beam onto a substrate to be exposed mounted on a second stage;

wherein said illuminating optical system comprises:
- shaping means for shaping the charged particle beam into a charged particle beam having a linear section; and
- deflecting means for deflecting the whole charged particle beam shaped by said shaping means in a direction of the linear section of the charged particle beam, and
- at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

45. A charged particle beam exposure apparatus comprising:
- an illuminating optical system for irradiating a charged particle beam emitted from a beam source onto a mask mounted on a first stage; and
- a projecting optical system for projecting a charged particle beam onto a substrate to be exposed mounted on a second stage;
- wherein said beam source comprises:
  - a wedge-shaped charged particle emission electrode; and
  - an electrode surrounding said charged particle emission electrode, and
- at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

46. A method of adjusting a charged particle beam exposure apparatus comprising:
- an illuminating optical system for irradiating a charged particle beam emitted from a beam source onto a mask mounted on a first stage;
- a projecting optical system for projecting the charged particle beam onto a substrate to be exposed mounted on a second stage;
- first measuring means for measuring a position of said first stage;
- second measuring means for measuring a position of said second stage;
- calculating means for calculating a first deviation amount indicating a deviation of said first stage from a predetermined position on the basis of the position of said first stage measured by said first measuring means and a second deviation amount indicating a deviation of said second stage from a predetermined position on the basis of the position of said second stage measured by said second measuring means; and
- correcting means for correcting a position, on said substrate, of the charged particle beam irradiated onto said substrate on the basis of the first and second deviation amounts calculated by said calculating means,
- wherein at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the steps of:
- measuring the position of said first stage by using said first measuring means and the position of said second stage by using said second measuring means;
- calculating the first deviation amount indicating a deviation of said first stage from a predetermined position on the basis of the position of said first stage measured by said first measuring means and the second deviation amount indicating a deviation of said second stage from a predetermined position on the basis of the position of said second stage measured by said second measuring means by using said calculating means; and
- correcting the position, on said substrate, of the charged particle beam irradiated onto said substrate on the basis of the first and second deviation amounts calculated by said calculating means by using said correcting means.

47. A method of adjusting a charged particle beam exposure apparatus comprising:
- an illuminating optical system for irradiating a charged particle beam emitted from a beam source onto a mask mounted on a first stage;
- a projecting optical system for projecting the charged particle beam onto a substrate to be exposed mounted on a second stage;
- first measuring means for measuring a vertical distance to a surface of said substrate;
- second measuring means for measuring an inclination of the surface of said substrate to an optical axis of the charged particle beam; and
- correcting means for correcting the vertical distance to the surface of said substrate to a predetermined distance on the basis of the vertical distance measured by said first measuring means and correcting the surface of said substrate to be perpendicular to the optical axis of the charged particle beam on the basis of the inclination measured by said second measuring means,
- wherein at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the steps of:
- measuring the vertical distance to the surface of said substrate by using said first measuring means;
- measuring the inclination of the surface of said substrate to the optical axis of the charged particle beam by using said second measuring means; and
- correcting the vertical distance to the surface of said substrate to a predetermined distance on the basis of the vertical distance measured by said first measuring means and correcting the surface of said substrate to be perpendicular to the optical axis of the charged particle beam on the basis of the inclination measured by said second measuring means by using said correcting means.

48. A method of adjusting a charged particle beam exposure apparatus comprising:

an illuminating optical system for irradiating a charged particle beam emitted from a beam source onto a mask mounted on a first stage;

a projecting optical system for projecting the charged particle beam onto a substrate to be exposed mounted on a second stage;

calculating means for calculating distortion to be applied to said mask to obtain desired positioning accuracy; and distortion applying means for applying distortion to said mask on the basis of the distortion calculated by said calculating means, wherein at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the steps of:

calculating the distortion to be applied to said mask to obtain desired positioning accuracy by using said calculating means; and applying distortion to said mask on the basis of the distortion calculated by said calculating means by using said distortion applying means.

49. A method of adjusting a charged particle beam exposure apparatus comprising:

an illuminating optical system for irradiating a charged particle beam emitted from a beam source onto a mask mounted on a first stage; and a projecting optical system for projecting the charged particle beam onto a substrate to be exposed mounted on a second stage;

wherein said illuminating optical system comprises:

shaping means for shaping the charged particle beam into a charged particle beam having a linear section; and deflecting means for deflecting the whole charged particle beam shaped by said shaping means in a direction of the linear section of the charged particle beam, and at least one of said illuminating optical system and said projecting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory, comprising the step of, letting l and w be a length and a width, projected on said mask, of the charged particle beam shaped by said shaping means of said illuminating optical system, respectively, W be a width of a transfer region on said mask, and v be a moving velocity of said mask stage, scanning the whole charged particle beam shaped by said shaping means by using said deflecting means under conditions of a width of not less than W+l and a period of w/nv (n: positive integer).

50. A charged particle beam exposure apparatus according to claim 35, wherein said adjusting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

51. A method of adjusting a charged particle beam exposure apparatus according to claim 38, wherein said adjusting optical system comprises a charged particle beam optical element which forms a partially rotationally symmetrical electromagnetic field in at least a portion of a space and makes a sectional shape of a charged particle beam passing through the electromagnetic field larger in a binormal direction to a trajectory of the beam than in a principal normal direction to the trajectory.

* * * * *